(12) United States Patent
Schuster et al.

(10) Patent No.: US 6,646,718 B2
(45) Date of Patent: Nov. 11, 2003

(54) PROJECTION OBJECTIVE HAVING ADJACENTLY MOUNTED ASPHERIC LENS SURFACES

(75) Inventors: Karl-Heinz Schuster, Königsbronn (DE); David R. Shafer, Fairfield, CT (US); Wilhelm Ulrich, Aalen (DE); Helmut Beierl, Heidenheim (DE); Wolfgang Singer, Aalen (DE)

(73) Assignee: Carl Zeiss Semiconductor Manufacturing Technologies AG, Oberkochen (DE)

( * ) Notice: Subject to any disclaimer, the term of this patent is extended or adjusted under 35 U.S.C. 154(b) by 0 days.

(21) Appl. No.: 10/177,580

(22) Filed: Jun. 24, 2002

(65) Prior Publication Data

US 2003/0179356 A1 Sep. 25, 2003

Related U.S. Application Data

(63) Continuation of application No. PCT/EP00/13148, filed on Dec. 22, 2000.
(60) Provisional application No. 60/173,523, filed on Dec. 29, 1999.

(30) Foreign Application Priority Data

Jan. 22, 2000 (DE) .......................................... 100 02 626
May 4, 2000 (DE) .......................................... 100 21 739

(51) Int. Cl.$^7$ ........................ G03B 27/54; G03B 27/42; G02B 3/00
(52) U.S. Cl. .......................... 355/67; 355/53; 359/649
(58) Field of Search ..................... 355/53, 55, 67–71; 359/649, 754–756, 682, 683

(56) References Cited

U.S. PATENT DOCUMENTS

| 4,757,354 A | | 7/1988 | Sato et al. |
| 4,861,148 A | | 8/1989 | Sato et al. |
| 5,724,121 A | | 3/1998 | McKinley et al. |
| 5,835,285 A | | 11/1998 | Matsuzawa et al. |
| 5,990,926 A | | 11/1999 | Mercado |
| 5,999,331 A | * | 12/1999 | Yamamoto ................... 359/692 |
| 6,075,653 A | | 6/2000 | Narimatsu et al. |
| 6,166,864 A | * | 12/2000 | Horiuchi ..................... 359/687 |
| 6,560,031 B1 | * | 5/2003 | Shafer et al. ................ 359/649 |

FOREIGN PATENT DOCUMENTS

| DE | 19818444 | 10/1998 |
| EP | 0332201 | 9/1989 |
| EP | 0816892 | 1/1998 |
| EP | 0851304 | 7/1998 |
| EP | 1079253 | 2/2001 |
| JP | 10-325922 | 12/1998 |
| JP | 11-231219 | 8/1999 |

* cited by examiner

Primary Examiner—Henry Hung Nguyen
(74) Attorney, Agent, or Firm—Walter Ottesen

(57) ABSTRACT

A projection objective has at least five lens groups (G1 to G5) and has several lens surfaces. At least two aspheric lens surfaces are arranged so as to be mutually adjacent. These mutually adjacently arranged lens surfaces are characterized as a double asphere. This at least one double asphere (21) is mounted at a minimum distance from an image plane (0') which is greater than the maximum lens diameter (D2) of the objective.

11 Claims, 9 Drawing Sheets

PROJECTION OBJECTIVE HAVING ADJACENTLY MOUNTED ASPHERIC LENS SURFACES

RELATED APPLICATIONS

This is a continuation application of International patent application PCT/EP 00/13148, filed Dec. 22, 2000, and claiming priority of U.S. provisional application No. 60/173,523, filed Dec. 29, 1999, and German applications 100 02 626.5 and 100 21 735.7, filed Jan. 22, 2000 and May 4, 2000, respectively.

BACKGROUND OF THE INVENTION

International patent publication WO 99/52004 discloses catadioptric optic projection objectives which include a plurality of aspheric lens surfaces. For example, the projection objective shown in FIG. 4 includes 12 aspheric lens surfaces for 15 lenses. The manufacturing costs of aspheric lens surfaces with the accuracy required in microlithography are very high. Accordingly, these objectives are of little interest in the marketplace because of the many required aspheric lens surfaces.

European patent publication 0 322 201 discloses an optical projection system especially for photolithography. The projection objective known from this publication includes five lens groups. The first, second, third and fifth lens groups each have only one lens. In part, the lenses are provided with aspheric lens surfaces. An aspheric object end mounted lens surface of the fifth lens group follows an aspheric lens surface mounted in the fourth lens group at the image end.

European patent publication 0 851 304 discloses the adjacent mounting of aspheric lens surfaces in a projection objective. These aspheric lenses are supported so as to be displaceable in the radial direction. The projection objective is matched via the relative movement of the lenses. The aspheric lens surfaces are especially rotationally unsymmetrical because of the possibility of displacing the aspheres in radial direction with respect to each other. Because of the movable support of the aspheric lenses, this arrangement is not suitable for every projection objective because projection objectives designed especially for short wavelengths react sensitively to the smallest position change of the individual lenses. Accordingly, the position stability, which is achievable because of the special support of the lenses, is not sufficient in order to reliably ensure a good imaging quality.

German patent publication 198 18 444 discloses a projection optic arrangement having a purely refractive projection objective which includes six lens groups G1 to G6. In this projection objective, the lens groups G1, G3 and G5 have positive refractive power. The lens groups G2 and G4 have negative refractive power. To correct imaging errors, some lenses, especially in the fourth and fifth lens groups, have aspheric lens surfaces.

German patent publication 199 42 281.8 discloses additional projection exposure objectives which have six lens groups. The second lens group and the fourth lens group have negative refractive power. In the projection objectives known from this publication, lenses having aspheric lens surfaces are preferably arranged in the first three lens groups. A minimum number of spherical lens surfaces are arranged between the aspheric lens surfaces. This minimum spacing between the aspheric lens surfaces appears necessary so that the utilized aspheric lenses can develop their optimal effect.

From U.S. Pat. No. 4,871,237 it is already known to match an objective in dependence upon barometric pressure via the refractive index of a fill gas in the lens intermediate spaces. For example, spherical aberration, coma and other imaging errors can be corrected with a suitable combination of intermediate spaces.

U.S. Pat. No. 5,559,584 discloses introducing a protective gas into the intermediate spaces between a wafer and/or a reticle and the projection objective in a projection exposure system for manufacturing microstructured components.

SUMMARY OF THE INVENTION

It is an object of the invention to provide a projection objective and a projection exposure system as well as a method for manufacturing microstructured components. These components are improved with respect to the imaging quality and the resolution capacity. Furthermore, it is an object of the invention to reduce manufacturing costs.

The projection objective of the invention defines a maximum lens diameter (D2) and includes: a plurality of lenses defining an object plane (0) and an image plane (0'); at least two of the lenses having respective mutually adjacent lens surfaces which are aspheric to define a double asphere; the double asphere being mounted at a distance from the image plane (0') corresponding at least to the maximum lens diameter (D2); the lenses of the double asphere defining a mean lens diameter; and, the mutually adjacent lens surfaces being mounted at a spacing from each other which is less than half of the mean lens diameter.

In a projection objective having a plurality of lenses, the measure of arranging the double asphere at a spacing of at least the maximum lens diameter of the objective away from the image plane (especially the wafer plane), improves the imaging qualities of a projection objective in comparison to a projection objective without such double aspheres. In the above, at least two mutually adjacent mounted lens surfaces are aspheric and this is identified as a double asphere. The spacing between the aspheric lens surfaces of the double asphere is maximally half the lens diameter of the mean diameter of the double asphere. The numerical aperture can especially be increased in a refractive projection objective with the use of at least one double asphere in that the first convex form is shortened so that, at a constant length of the projection objective, the third convex form experiences an increase of the numerical aperture of approximately 0.03 to 0.05.

Especially in purely refractive projection objectives, the use of double aspheres with an arrangement in the first three lens groups has been shown to be especially advantageous.

In lithographic objectives, there are particular locations, which operate especially well on difficult to control aberrations, when these locations are aspherized. Precisely here it is purposeful to utilize especially the effectiveness at the corresponding location via a complex aspheric function. The region of the first restriction and the end of the second convex form as well as regions behind the diaphragm are predestined. Since the technical realization of complex aspheres is subjected to technical limits, the complex asphere functions are realized by means of double aspheres. In this way, a still more extensive correction is possible and the aspheres of the double asphere are technically realizable.

Furthermore, it has been shown to be advantageous to provide aspheric lens surfaces as aspheric lens surfaces of the double asphere. The radius of the aspheric lens surfaces of the best-fitting spherical lens surface (identified as the profile radius) differ very little. Preferably, the reciprocal values of the profile radius or radii of the double aspheres deviate less than 30% from each other. As a reference value, the reciprocal value of the larger radius in magnitude is applied.

It has been shown to be especially advantageous that the apex radii of the aspherical lens surfaces of the double aspheres differ by less than 30% with reference to the larger apex radius in magnitude.

In the area of microlithography, the developmental work is directed to increasing the resolution. On the one hand, the resolution can be increased by increasing the numerical aperture, utilizing ever smaller wavelengths and even by correcting the occurring imaging errors. For an increase of the image end numerical aperture, the last convex form of the objective arranged at the image end is increased. However, it is problematic that only a fixed pregiven space can be made available for the objective. Accordingly, in order to provide a larger numerical aperture, it is therefore necessary to save space in other regions of the objective.

It has been shown to be advantageous to provide the space needed for increasing the numerical aperture by shortening the first convex form. With the first convex form, especially the input telecentrics and the distortion are corrected. By utilizing double aspheres, it is possible to correct the input telecentrics as well as the distortion with ease and at a short distance. With the double asphere, a variable adjustment of the location is made available at a short distance. With the possibility of varying the location, the distortion can be corrected. Especially the input telecentrics is corrected because the angle can be flexibly influenced.

Corrective means has already been made available in the input region of the objective especially with the use of a double asphere in a refractive projection objective in the region of the first two lens groups, that is, up to and including the first lens group of negative refractive power. Accordingly, the corrective means, which is required in the third convex form, are reduced for ensuring a uniform or constant imaging quality.

Furthermore, by providing a double asphere in the forward region of the objective, especially up to the second restriction, the number of lenses is reduced. This operates advantageously on the manufacturing costs.

In purely refractive projection objectives, it has been shown to be advantageous to provide aspheric lens surfaces in the forward region of the objective ahead of the second restriction to improve the imaging quality. For example, for a numerical aperture of 0.83, the deviation from the wavefront of a spherical wave is reduced to less than 6 m$\lambda$ with a field of 8×26 mm$^2$ referred to 248 nm.

The imaging characteristics of the objective can be changed because of fluctuations of the atmospheric pressure. In order to compensate for such pressure fluctuations, it has been shown to be advantageous to charge an intermediate space between two lens surfaces with pressure in a targeted manner so that pressure changes, especially of the atmospheric pressure, can be compensated. Furthermore, the targeted application of pressure can be used for a further reduction of imaging errors.

Furthermore, it has been shown to be advantageous to provide at least one of the end plates with a pressure manipulator so that a curvature of the plate or lens can be generated with a two-sided application of pressure of the particular lens or the particular plate. For a three-point support of the end plate and an application of pressure of the gas space, the three-waviness during operation is corrected in a targeted manner by means of the through-bending of the end plate. With an n-point support, an n-waviness can be corrected.

A force, which is directed in the z-direction, for curving the lens can be introduced via coaxially mounted actuators, especially, piezos. The force, which is introduced by the actuators, is directed to the lens center point.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
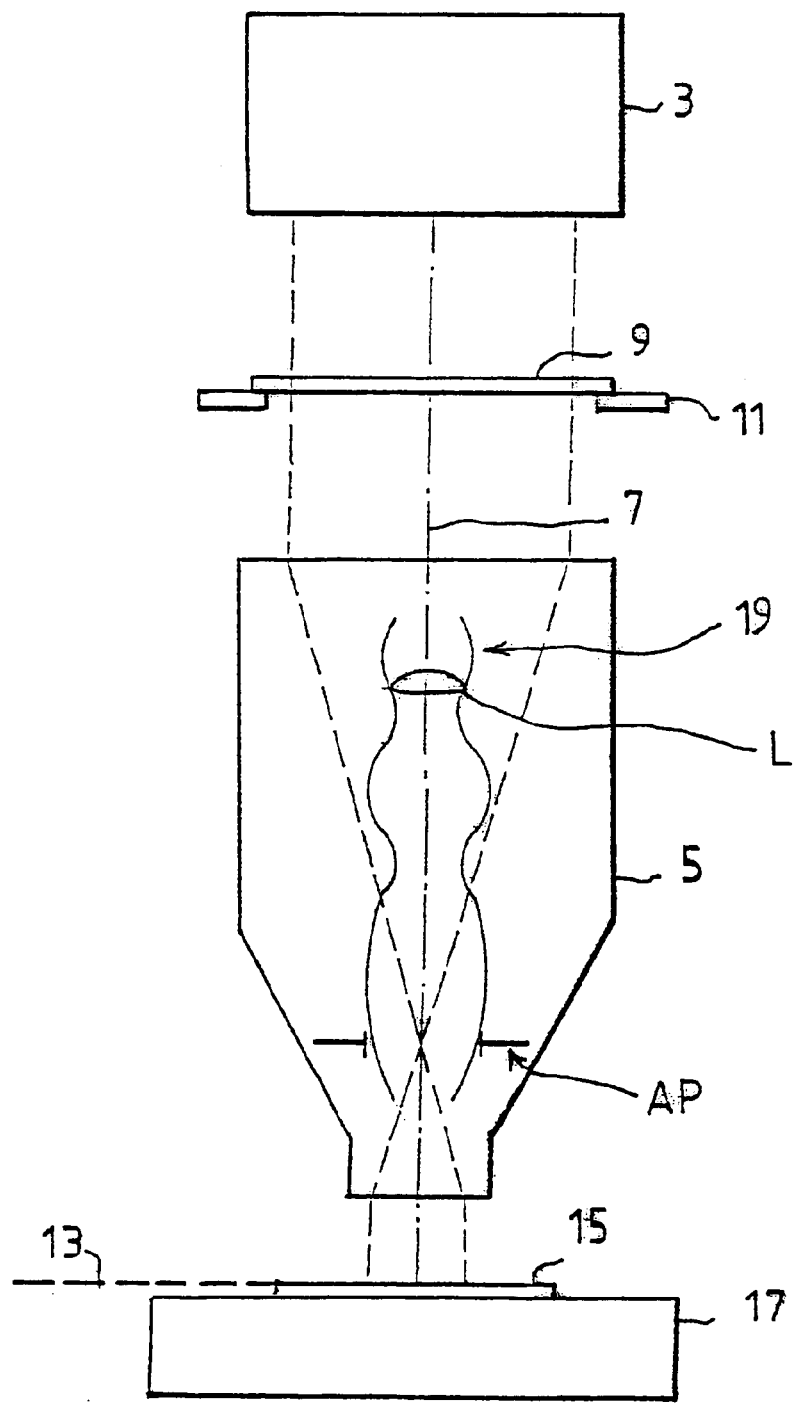
FIG. 1 shows a projection exposure system.

Referring to FIG. 1, the principle configuration of a projection exposure system is described. The projection exposure system 1 includes an illuminating unit 3 and a projection objective 5. The projection objective 5 includes a lens arrangement 19 having an aperture diaphragm AP. An optical axis 7 is defined by the lens arrangement 19. Different lens arrangements are explained in greater detail hereinafter with respect to FIGS. 2 to 6. A mask 9 is mounted between the illuminating unit 3 and the projection objective 5. The mask 9 is held in the beam path by means of a mask holder 11. Such masks 9, which are used in microlithography, have a micrometer-nanometer structure which is imaged demagnified on an image plane 13 by means of the projection objective 5 up to a factor of 10, especially by the factor 4. In the image plane 13, a substrate 15 or a wafer is held. The substrate 15 or wafer is positioned by a substrate holder 17.

The minimal structures, which can still be resolved, are dependent upon the wavelength $\lambda$ of the light, which is used for the illumination, as well as in dependence upon the image side numerical aperture of the projection objective 5. The maximum attainable resolution of the projection exposure system 1 increases with falling wavelength $\lambda$ of the exposure illuminating unit 3 and with an increasing image end numerical aperture of the projection objective 5.

Figure 2:
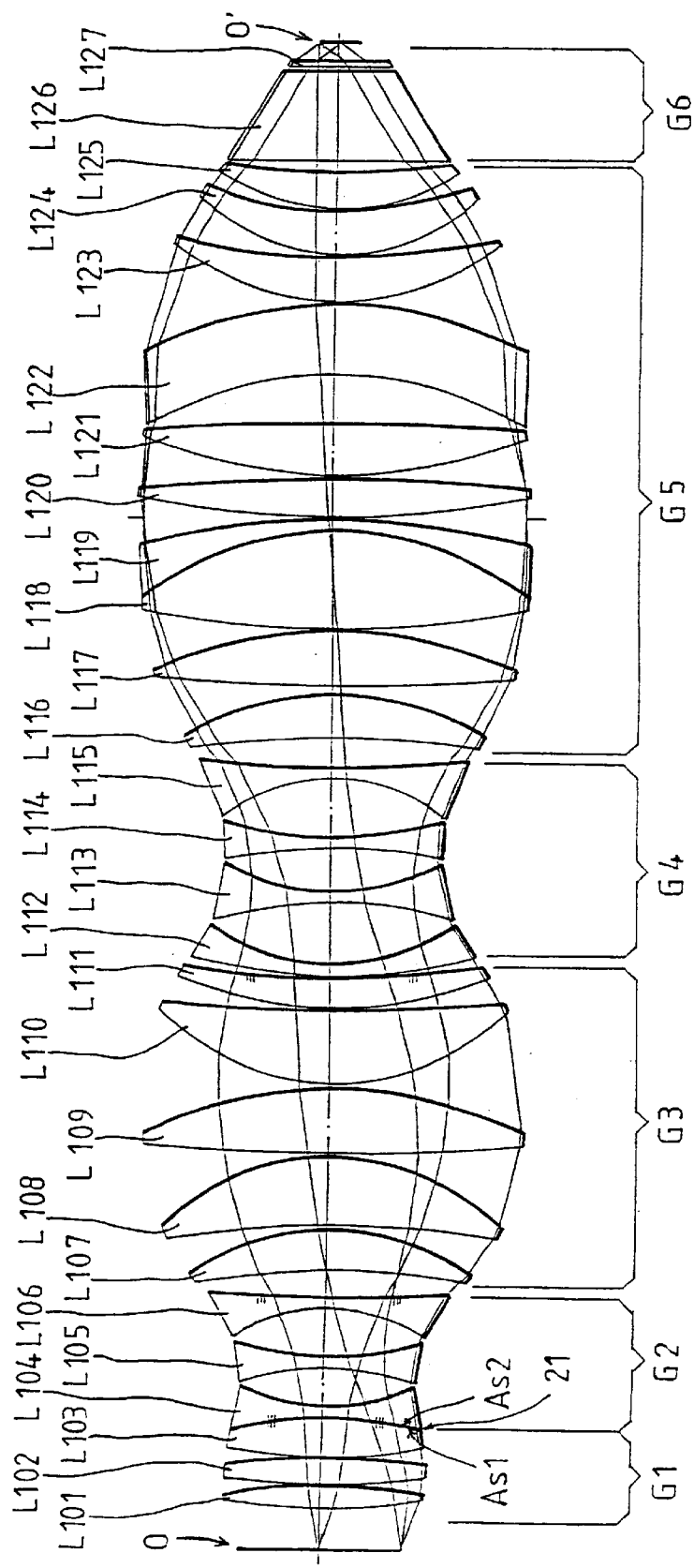
FIG. 2 shows a projection objective for the wavelength 157 nm having a numerical aperture of 0.8.

The projection objective 19 shown in FIG. 2 includes six lens groups G1 to G6. This projection objective is designed for the wavelength 157 nm. The first lens group G1 or first convex form is defined by the lenses L101 to L103 which are all biconvex lenses. This first lens group has positive refractive power. The last lens surface of this lens group G1, which is mounted at the image end, is aspherized. This lens surface is identified by AS1. The last lens of this lens group G1 is a biconvex lens which can be clearly assigned to the first lens group.

The lens group G2 or first constriction, which follows the lens group G1, includes the three lenses L104 to L106. This lens group G2 has negative refractive power and defines a restriction. An object end mounted lens surface AS2 of the lens L104 is aspheric. Furthermore, the image end mounted lens surface of lens L106 is aspheric. A double asphere is formed by the two lens surfaces AS1 and AS2.

The lens group G3 has positive refractive power and is defined by the lenses L107 to L111. The last lens surface of this lens group is the lens L111 which is arranged at the image end and is aspherized. This lens group is a convex form.

The second lens group G4 of negative refractive power continues from the third lens group. This lens group G4 is defined by the lenses L112 to L115. This lens group defines a constriction.

The fifth lens group G5 has the lenses L116 to L125 and has positive refractive power and includes an aperture diaphragm AP which is mounted between the lens L119 and the lens L120.

The sixth lens group G6 is defined by the lenses or plates L126 and L127. This objective is designed for the wavelength 157 nm having a spectral bandwidth of the illuminating source of 1.5 pm and the lenses L113 to L115 and L119 for this objective are of sodium fluoride. With the use of a second material (here sodium fluoride), especially chromatic errors can be corrected. The chromatic transverse errors are significantly reduced because of the use of NaF in the first restriction. Even the chromatic longitudinal error is somewhat reduced. The largest individual contribution to correction of the chromatic longitudinal errors is achieved with the use of NaF in the lens group G5.

The positive lenses L116 to L118 of the lens group G5 continue from the lens group G4 and are of lithium fluoride. With the use of lithium fluoride at this location in the objective, especially the monochromatic correction is facilitated because only small individual refractive powers are needed for achromatization because of the larger dispersion distance of lithium fluoride and sodium fluoride than of calcium fluoride and sodium fluoride. The basic configuration does not differ so significantly from a chromatic objective because of the special material selection.

The two positive lenses, which are arranged after the diaphragm, are likewise of lithium fluoride and also make, as explained with respect to the lithium lenses mounted ahead of the diaphragm, an important contribution to the correction of the chromatic longitudinal error.

The lens L122, whose two surfaces run almost at a constant spacing to each other, comprises calcium fluoride. The lens is very significant for the monochromatic correction and has only a slight influence on the chromatic longitudinal error.

The last three lenses of the fifth lens group G5, L123 to L125, are of lithium fluoride. These lenses supply a smaller but nonetheless very valuable contribution to the correction of the chromatic longitudinal error.

The sixth lens group includes the lenses or planar plates L126 and L127 which comprise calcium fluoride.

This objective is designed for illuminating a field of 8×26 mm. The structural length from position 0 to position 0' is 1,000 mm. The numerical aperture is 0.8. The precise lens data are set forth in Table 1.

The aspheric surfaces are in all embodiments described by the equation:

$$P(h) = \frac{\delta \cdot h \cdot h}{1 + \sqrt{1 - (1+K) \cdot \delta \cdot \delta \cdot h \cdot h}} + C_1 h^4 + \ldots + C_n h^{2n+2}$$

$$\delta = 1/R$$

wherein: P is the arrow height as a function of the radius h (elevation to the optical axis 7) with the aspheric constants $C_1$ to $C_n$ given in the Tables. R is the apex radius.

Figure 3:
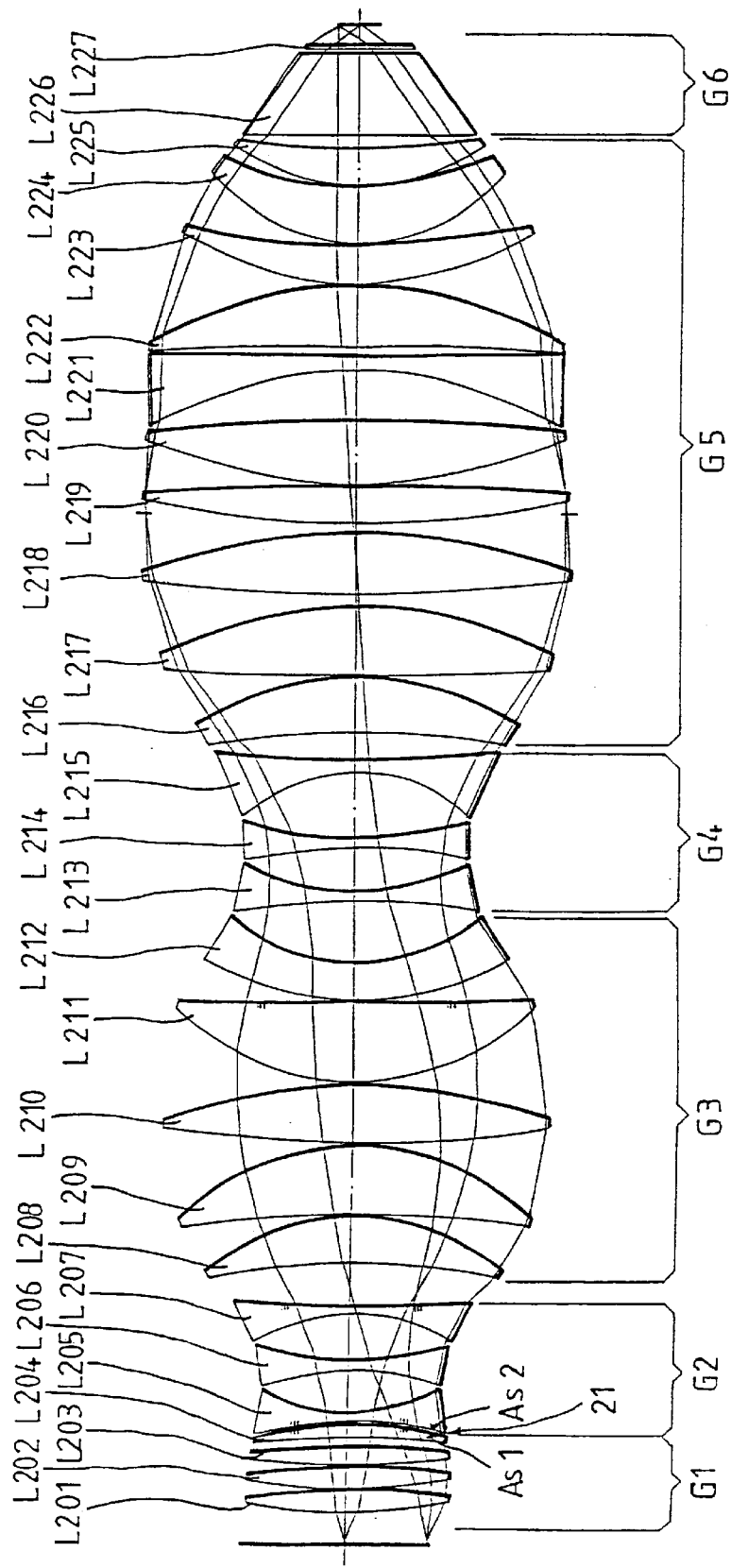
FIG. 3 is a projection objective for the wavelength 248 nm having a numerical aperture of 0.83.

The projection objective shown in FIG. 3 includes six lens groups G1 to G6 having the lenses L201 to L225 and a divided end plate (L226, L227). This objective is designed for the illumination wavelength 248 nm. The space required for this projection objective 19 amounts precisely to 1,000 mm from object plane 0 to image plane 0'. At the image end, this objective 19 has a numerical aperture of 0.83. The field which can be exposed by this projection objective is 8×26 mm.

The first lens group G1 includes the lenses L201 to L204 of which the lenses L201 to 203 are biconvex lenses.

The first lens L204 of the lens group G1 has an aspheric form on the image end lens surface. This asphere is identified by AS1.

The second lens group G2 includes the three lenses L205 to L207. These lenses have a biconcave form and the lens surfaces of the lenses L205 and L207, which face toward the respective bounding lens groups, are aspheric. The aspheric lens surface of the lens L205 is identified by AS2. In this way, a double asphere is formed by the two mutually adjacent aspheric lens surfaces AS1 and AS2. The last lens of the lens group G2 is provided as aspheric on the side facing the wafer.

The third lens group includes the lenses L208 to L21. With this lens group G3, a convex form is provided. The lens L211 is made aspheric on the image end lens surface.

The fourth lens group G4 is formed by the lenses L213 to L215 which are all configured to be biconcave. This lens group G4 is the second lens group of negative refractive power. With this lens group, a restriction is formed.

The lens group G5 includes the lenses L216 to L225. An aperture diaphragm is mounted between the lenses L218 and L219. The diaphragm curvature between the peripheral ray at the diaphragm at a numerical aperture of 0.83 and the intersect point of the chief ray with the optical axis is 30.9 mm. With this lens group, a convex form is provided.

The sixth lens group G6 includes the lenses L226 and L227 and these lenses are configured as planar plates.

The precise lens data of this projection objective 19 are set forth in Table 2. For the same structural length of the objective from 0 to 0' of 1,000 mm compared to FIG. 2, the aperture is increased further to 0.83 with an excellent correction.

Figure 4:
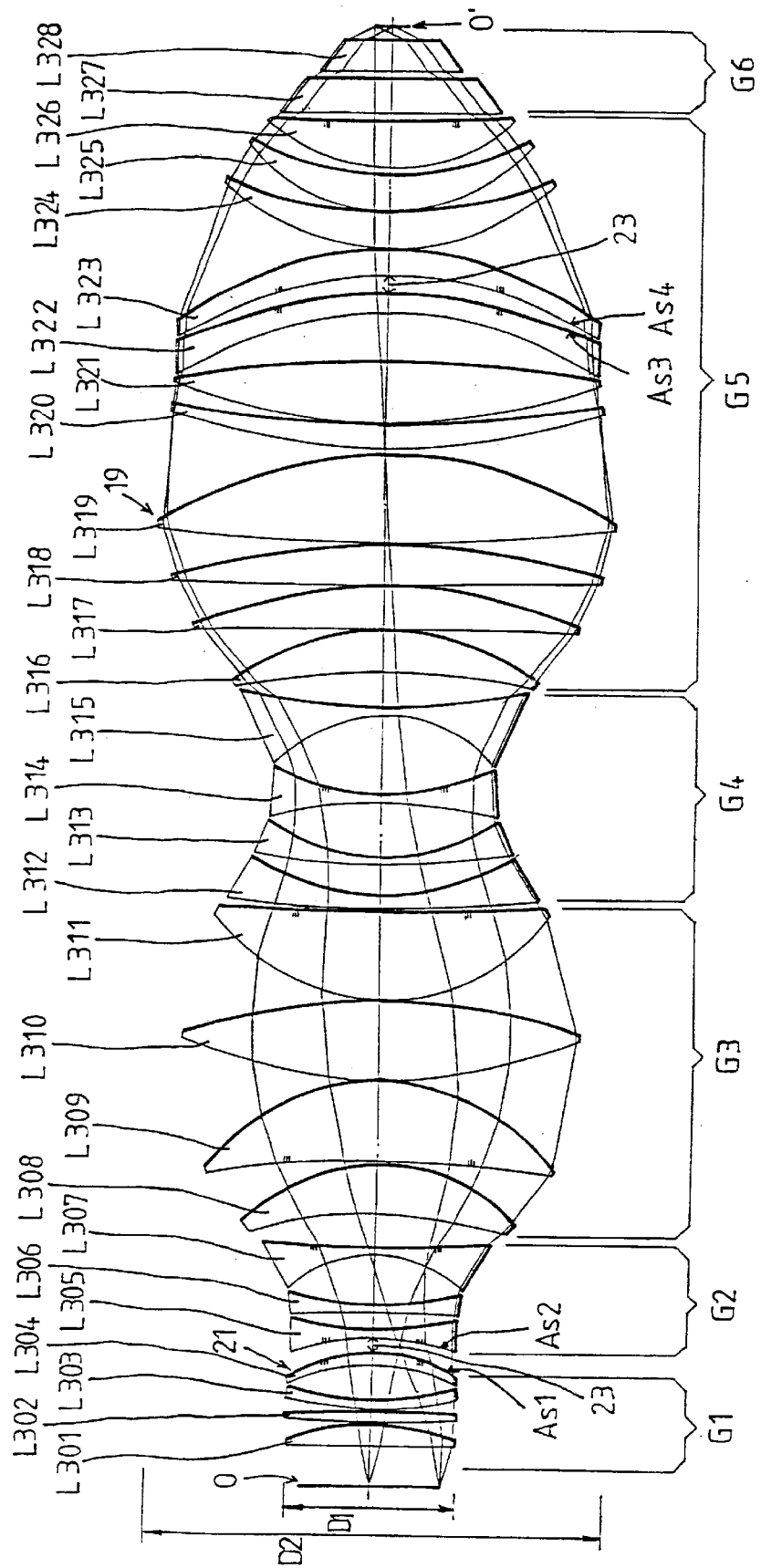
FIG. 4 is a projection objective for the wavelength 248 nm having a numerical aperture of 0.9.

The projection objective shown in FIG. 4 includes six lens groups having the lenses L301 to L327. The objective is designed for the illuminating wavelength 248 nm and has a numerical aperture of 0.9.

The first lens group G1 includes the lenses L301 to L304. This lens group has a positive refractive power. The refractive power especially of lenses L302 to L303 is very low. The focal length of this lens at L302 is 1077.874 mm and is −92397.86 mm at L303.

A lens group of negative refractive power G2 continues from this last lens group and is formed by the three lenses L305 to L307. The first lens surface of this lens group G2 is arranged at the image end and is made aspheric and is identified by AS1. The lens surface of lens L305 facing toward the lens surface AS1 is made aspheric so that a double asphere is formed by the lens surfaces AS1 and AS2. Between these aspheric lens surfaces AS1 and AS2, there is a clearly recognizable spacing provided in contrast to the previous embodiment. In this double asphere, the equidistant arrangement of the surfaces AS1 and AS2 is no longer completely utilized and the double asphere opens somewhat toward the outside.

The next lens group G3 has a positive refractive power and includes the lenses L308 to L311. This lens group G3 includes an aspheric lens surface and this aspheric lens surface is mounted on the image side on the lens L311.

The second lens group of negative refractive power G4 includes the lenses L312 to L315. The lens surface of the lens L314 mounted at the image end is made aspheric.

The next lens group G5 has a positive refractive power and includes the lenses L316 to L325. The diaphragm AP is mounted between the lenses L319 and L320. The two mutually adjacent lens surfaces of lenses L321 and L322 are aspheric and are identified as AS3 and AS4. A double asphere is formed by these aspheres AS3 and AS4. An air space is enclosed by the surfaces AS3 and AS4. With this double asphere, especially the spherical aberration and the sine condition at high aperture are better decoupled and easily corrected.

The sixth lens group includes the lenses L326 and L327 which are configured as thick planar plates. The intermediate space defined by these planar plates is chargeable with an overpressure and an underpressure and/or with a gas for compensating fluctuations of the atmospheric pressure. For more extended correction possibilities, it can be provided that at least one of the planar plates with or without refractive power (that is, also as a lens which is clearly thinner) compensates n-waviness under pressure variation and point mounting. For a targeted deformation of the lens, piezo actuators can be provided on the outer periphery.

The structural length of this objective from object plane 0 to image plane 0' is 1139.8 mm. The numerical aperture at the image end amounts to 0.9 with an exposable field of 27.2 mm in the diagonal. The precise lens data are set forth in Table 3.

Figure 5:
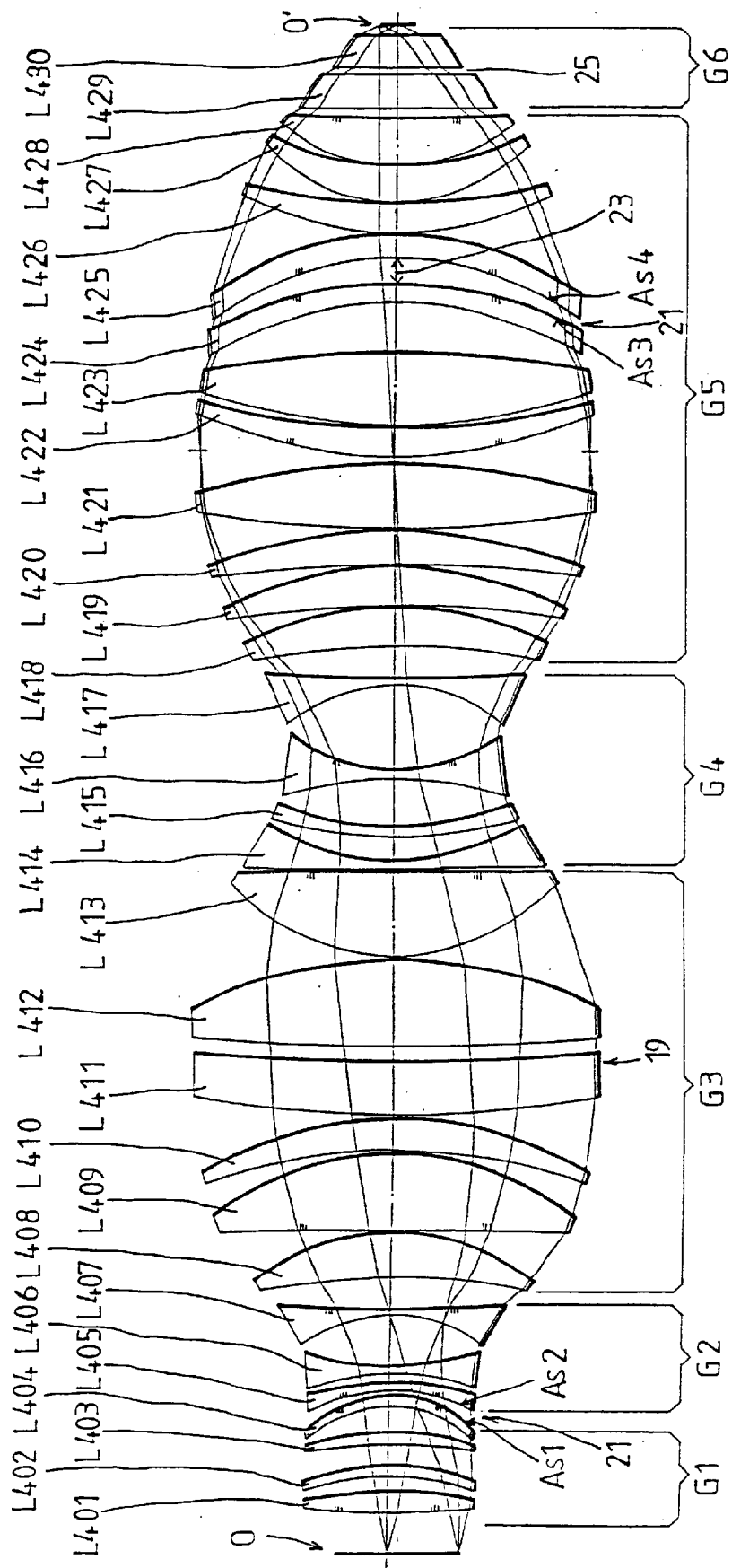
FIG. 5 is a projection objective for the wavelength 193 nm having a numerical aperture of 0.85.

The projection objective 19 shown in FIG. 5 includes six lens groups G1 to G6. This projection objective is designed for a wavelength of 193 nm. The first lens group G1 includes the lenses L401 to L404. Already the first object end mounted lens surface of the lens L401 is made aspheric. This asphere acts especially positively on dish-shaped traces and distortion with excellent entry telecentrics because this asphere is mounted at the location at which the best beam separation exists for the high-aperture lithographic objective.

The lens surface of lens L404, which is provided at the object end, is aspheric and is identified by AS1. A double asphere is formed by this lens surface AS1 and the lens surface of the lens L405 which is mounted at the image end and is likewise aspheric and is identified by AS2. This double asphere operates especially positively on dish-shaped traces while simultaneously providing good correction of the image errors caused by the high aperture. With increasing radial distance from the optical axis, the surfaces AS1 and AS2 of the double asphere have an increasing distance in the direction to the optical axis. This double asphere opens toward the outside and defines a complex corrective means with average beam separation.

The lens L404 belongs already to the second lens group which includes the lenses L405 to L407. This second lens group has a negative refractive power.

The first lenses L402 to L405 have an especially low refractive power $f_{L402}$=1397.664 mm, $f_{L403}$=509.911 mm, $f_{L404}$=1371.145 mm and $f_{L405}$=−342.044 mm. A further aspheric lens surface is provided at the image end on the lens L407.

The next lens group G3 has a positive refractive power and includes the lenses L408 to L413. The lens L409 has, at the object end, an aspheric lens surface and the lens L413 is provided with an aspheric lens surface at the image side. The aspheric lens L413 has a positive influence on the coma of higher order and on the 45° structures. The air space, which is provided between the lenses L411 and L412 is virtually equidistant.

The lens group G4 has a negative refractive power and is defined by the lenses L414 to L416. The lens L415 has an aspheric lens surface on the image side. This aspheric lens surface operates in a good mixture on aperture dependent and field dependent imaging errors, especially for objectives having a high aperture.

The next lens group G5 is defined by the lenses L417 to L427. A diaphragm AP is mounted between the lenses L420 to L421. The lens surface of the lens L422, which follows the diaphragm AP, has an aspheric form. With this aspheric lens, it is possible to carry out the correction of the spheric aberration without influencing other imaging errors. For this purpose, it is, however, necessary with the presence of a clear diaphragm curvature, that the aspheric surface projects into the region of a slide diaphragm.

Furthermore, the mutually adjacent lens surfaces of the lenses L423 and L424 (identified by AS3 and AS4) are made to have an aspheric form. With this follow-on double asphere, it is especially possible to have an excellent aplanar correction for highest numerical aperture. The simultaneous correction of the spheric aberration and the satisfaction of the sine condition is therefore possible.

The lens group G6 is configured by the lenses L428 to L429 which are configured as planar plates. It can, in turn, be provided that the intermediate space between the planar parallel plates 428 and 429 are chargeable with a fluid.

Quartz glass is provided as a lens material. To reduce the chromatic aberration, the lenses L408 and L409 as well as L413 can be made of calcium fluoride. To reduce the compaction effect because of the high radiation load, it can be provided that calcium fluoride be used as a material for the smaller one or for both planar parallel plates L428 and L429. It is noted that, in this projection objective, the maximum diameter of the lens group G3 has, with 398 mm, a greater maximum diameter than the lens group G5. This objective is very well corrected and the deviation from the wavefront of an ideal spherical wave is >=1.2 mλ referred to 193 nm. The spacing between object plane 0 and image plane 0' is 1188.1 mm and the exposable field is 8×26 mm. The precise lens data are set forth in Table 4.

Figure 6:
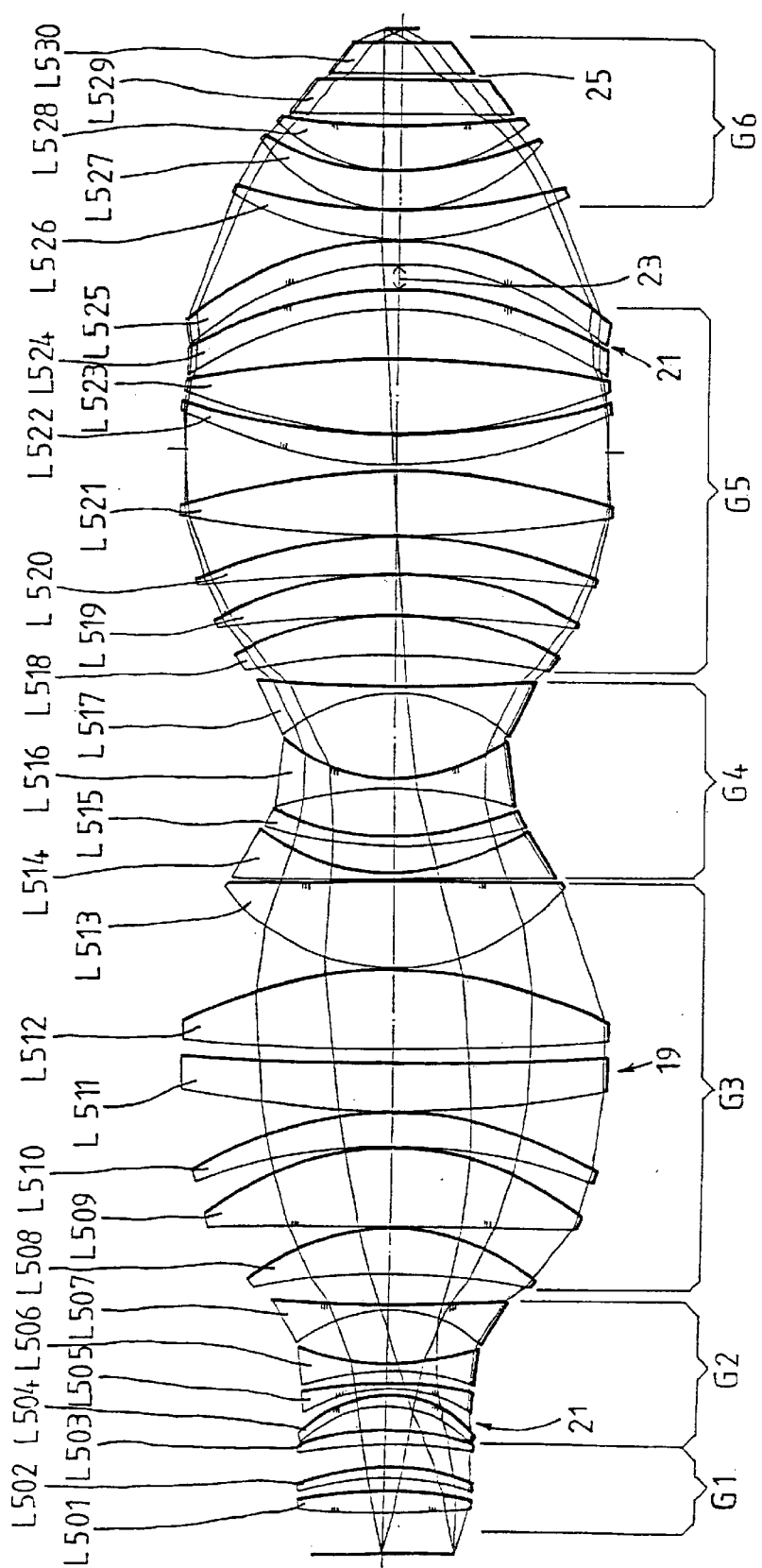
FIG. 6 is a projection objective for the wavelength 193 nm having a numerical aperture of 0.9.

The projection objective shown in FIG. 6 includes the lens groups G1 to G6 with the lenses L501 to L530. Planar plates are provided for L529 and L530. This projection objective is designed for the wavelength 193 nm and has a numerical aperture of 0.9. The spacing between the object plane 0 and the image plane 0' is 1174.6 mm. The exposable field has a size of 8×26 mm. Viewed macroscopically, this projection objective does not differ from the projection objective shown in FIG. 5. Again, especially the lenses L502 and L503 have a low refractive power. The lens L510 is provided especially for the quadratic correction.

Apart from the planar parallel plates L529 and L530, all lenses L501 to L528 are of quartz glass. This projection objective too is very well corrected and the deviation from the ideal wavefront of a spherical wave is <3.0 mλ referred to 193 nm. The lenses L510, L515, L522 have a low refractive power. The precise lens data are set forth in Table 5. The effect of the aspheric surfaces corresponds principally to the effects described with respect to FIG. 5. The effects are still greater because of the high numerical aperture of 0.9.

Figure 7:
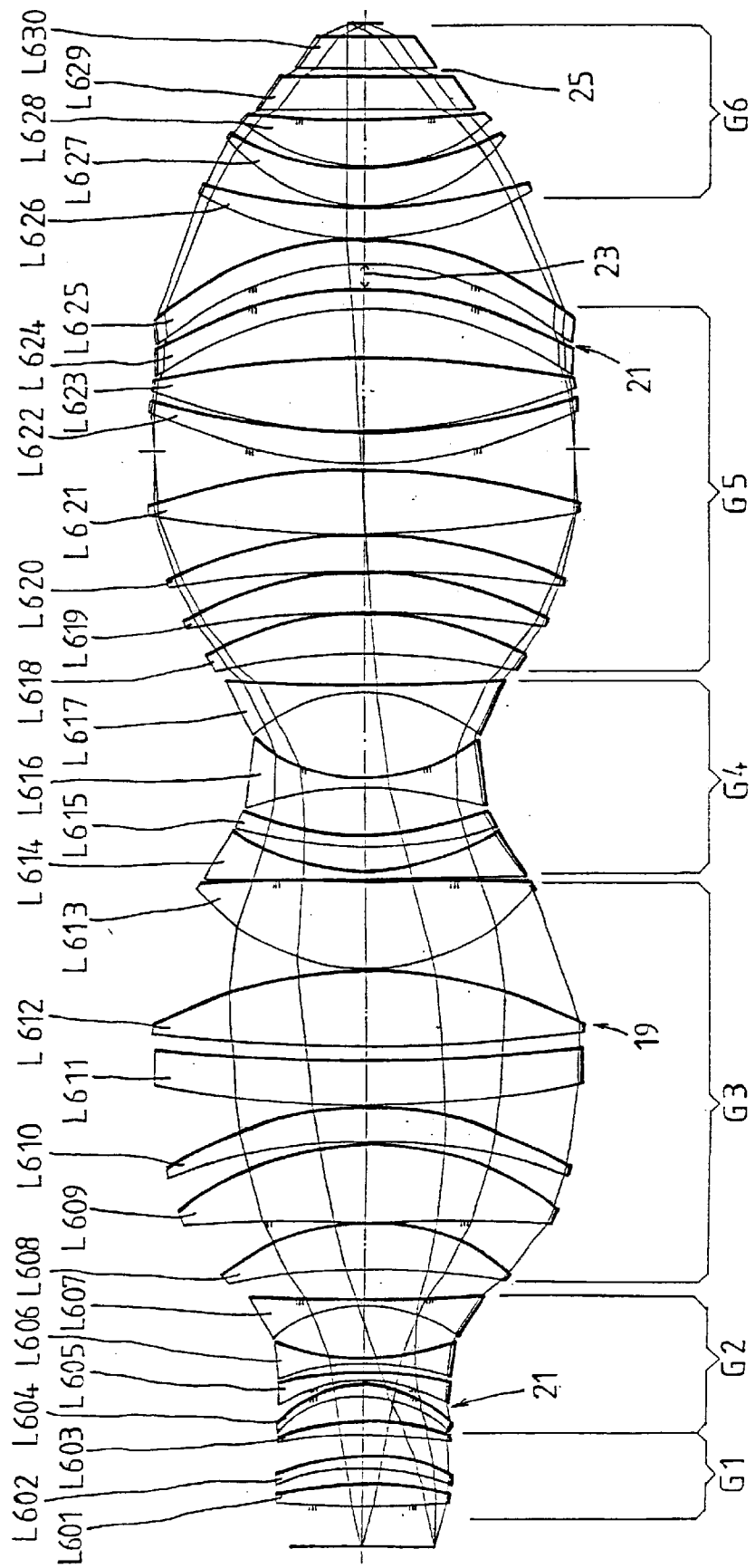
FIG. 7 is a projection objective for the wavelength 157 nm having a numerical aperture of 0.9.

The projection objective shown in FIG. 7 for the wavelength 157 nm includes six lens groups having lenses L601 to L630 with planar parallel plates L629 and L630. The structural length of this projection objective from object plane 0 to image plane 0' is 997.8 mm. A field of 7×22 mm can be exposed. The numerical aperture of this objective is 0.9. Calcium fluoride is provided as a lens material. A further correction of chromatic errors is achievable with the use of barium fluoride as a lens material for the lenses L614 to L617. The deviation from the wavefront of an ideal spherical wave is <1.8 mλ referred to 157 nm. Viewed macroscopically, the configuration of the projection objective shown in FIG. 7 differs only slightly from the projection objective described with respect to FIGS. 5 and 6. For this reason, reference is made to the description with respect to FIG. 5. The exact lens data are set forth in Table 6.

Figure 8:
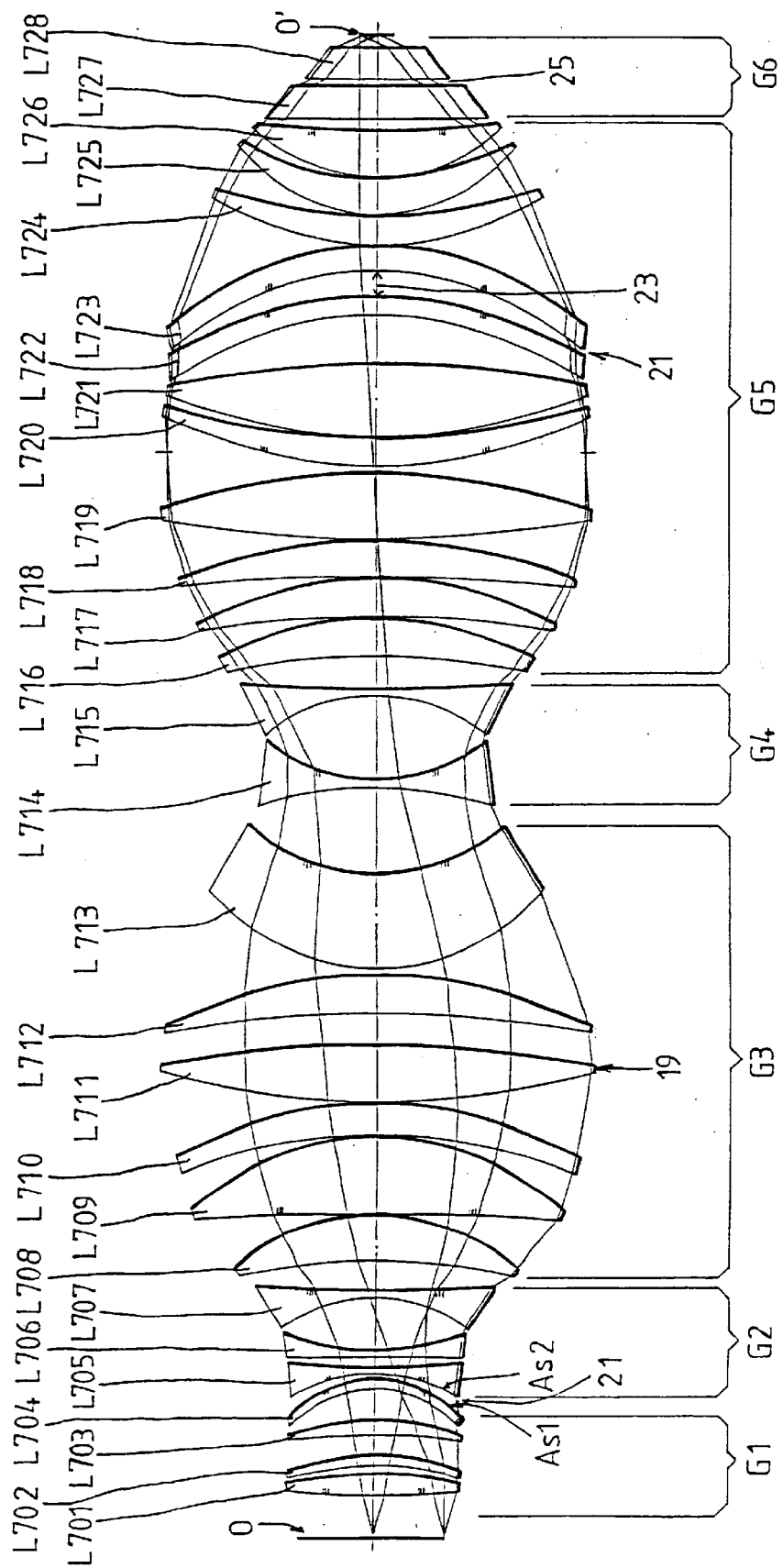
FIG. 8 is a projection objective for the wavelength 193 nm having a numerical aperture of 0.9.

The projection objective shown in FIG. 8 includes six lens groups G1 to G6. The first lens group includes the lenses L701 to L704. The lens L701 at the object side and the lens L704 at the image side have aspheric lens surfaces. This first lens group includes only lenses of positive refractive power which have approximately identical diameters.

The second lens group G2 follows and has a negative refractive power and includes the lenses L705 to L708. The lens L705 has an aspheric lens surface on the side facing toward lens L704 and this aspheric lens surface is identified by AS2. A double asphere 21 is formed by the two aspheric lens surfaces AS1 and AS2. This double asphere is curved toward the wafer and opens slightly in the radial direction. Furthermore, the lens L708 has an aspheric lens surface at the image end.

The third lens group G3 has lenses L709 to L714 and has a positive refractive power. This lens group includes two aspheric lenses L710 and L714. The air gap, which is formed between the lenses L712 and L713, has an almost constant thickness.

The fourth lens group G4 includes only two negative lenses L715 and L716 with which a restriction is formed. The lens L715 is provided at the image side with an aspherical lens surface.

The fifth lens group has lenses L717 to L727 and has a positive refractive power. The diaphragm AP is mounted between the lenses L720 and L721. In this lens group, a further double asphere 21 is provided which is formed by the two aspheric lens surfaces AS3 and AS4 of the lenses L723 and L724. Further aspheric lens surfaces are on the lens L721 on the object side and on lens L727 on the image side.

The last lens group G6 follows this lens group and is defined by the two planar parallel plates L728 and L729. An intermediate space 25 is formed by the mutually adjacent surfaces of the planar plates L728 and L729. The intermediate space 25 can be charged with pressure.

This projection objective is designed for the wavelength 193 nm and has a numerical aperture of 0.9. The distance between object plane 0 and image plane 0' is 1209.6 mm. A field of 10.5×26 mm can be exposed with this projection objective. The maximum deviation from the ideal wavefront of a spherical wave is 3.0 mλ referred to 193 nm. This deviation is determined by means of the program code CODE V. The precise lens data are set forth in Table 7.

Figure 9:
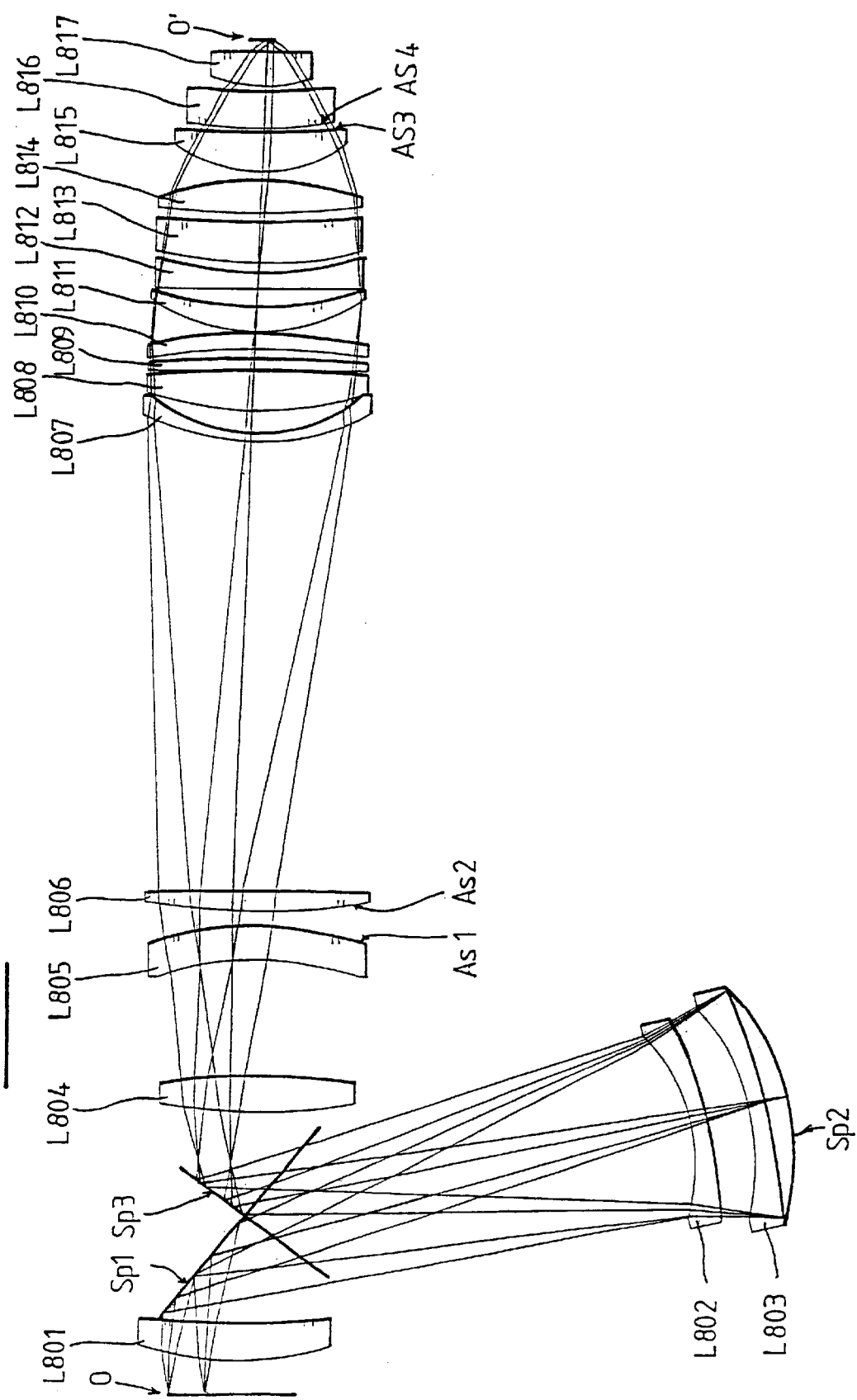
FIG. 9 is a catadioptric projection objective having a double asphere for the wavelength of 157 nm and having a numerical aperture of 0.8.

In FIG. 9, a catadioptric projection objective is shown which is designed for the wavelength 157 nm. A field of 22×7 mm can be exposed with this projection objective. The numerical aperture is 0.8. All lenses in this projection objective are made of calcium fluoride. The first lens L801 is provided with an aspheric lens surface on the image side. This aspheric lens supplies especially a valuable contribution to the correction of the distortion.

The radiation is deflected by mirror SP 1 and impinges on the lens L802 of negative refractive power. The next lens L803 is provided with an aspheric lens surface on the lens side on the image side in the beam path. This aspheric lens supplies an especially valuable contribution to the correction of the spherical aberration.

The radiation, which propagates from lens L803, is reflected back at the mirror SP 2 and passes the lenses L803 and L802 in the opposite sequence before it is directed via reflection at mirror SP 3 to the lens L804 which is mounted on an optical axis common with the lens L801. An intermediate image Z1 arises between the mirror SP 3 and lens L804. The next lenses L805 and L806 have aspheric lens surfaces AS1 and AS2 on the mutually adjacent surfaces. A double asphere is formed by these aspheres. Furthermore, the objective includes the lenses L807 to L818. The lenses L812, L814, L816 and L818 are provided with aspheric surfaces on the image side and the lens L817 has an aspheric lens surface on the object side. A double asphere is formed by the aspheric lens surfaces of the lenses L816 and L817.

The subject matter of PCT/EP 00/13148, filed Dec. 22, 2000, is incorporated herein by reference.

It is understood that the foregoing description is that of the preferred embodiments of the invention and that various changes and modifications may be made thereto without departing from the spirit and scope of the invention as defined in the appended claims.

TABLE 1

| M1197a LENSES | RADII | THICKNESSES | GLASSES | REFRACTIVE INDEX AT 157 nm | ½ FREE DIAMETER |
| --- | --- | --- | --- | --- | --- |
| 0 | infinite | 32.000000000 | N2 | 1.00000320 | 54.410 |
|  | infinite | 3.386300000 | N2 | 1.00000320 | 61.189 |
| L101 | 331.163350000 | 17.963900000 | CaF2 | 1.55840983 | 63.195 |
|  | −319.616060000 | 1.476400000 | N2 | 1.00000320 | 63.531 |
| L102 | 766.337390000 | 17.162600000 | CaF2 | 1.55840983 | 63.346 |
|  | −447.357070000 | 0.750000000 | N2 | 1.00000320 | 62.932 |
| L103 | 308.080750000 | 26.167800000 | CaF2 | 1.55840983 | 61.274 |
|  | −256.921560000AS | 0.781900000 | N2 | 1.00000320 | 59.279 |
| 104 | −199.459070000AS | 7.000000000 | CaF2 | 1.55840983 | 59.017 |
|  | 115.459900000 | 26.055700000 | N2 | 1.00000320 | 53.978 |

TABLE 1-continued

| | | | | | |
|---|---|---|---|---|---|
| L105 | −155.555940000 | 7.000000000 | CaF2 | 1.55840983 | 54.017 |
| | 181.538670000 | 32.685400000 | N2 | 1.00000320 | 57.637 |
| L106 | −105.047550000 | 7.623100000 | CaF2 | 1.55840983 | 59.819 |
| | −6182.626690000AS | 16.767300000 | N2 | 1.00000320 | 74.788 |
| L107 | −441.263450000 | 27.098000000 | CaF2 | 1.55840983 | 83.940 |
| | −151.990780000 | 2.318200000 | N2 | 1.00000320 | 88.568 |
| L108 | −613.725250000 | 45.372400000 | CaF2 | 1.55840983 | 103.501 |
| | −150.623730000 | 2.560000000 | N2 | 1.00000320 | 107.663 |
| L109 | 1648.391330000 | 42.538400000 | CaF2 | 1.55840983 | 119.260 |
| | −255.166800000 | 2.852600000 | N2 | 1.00000320 | 120.183 |
| L110 | 154.432580000 | 47.915200000 | CaF2 | 1.55840983 | 110.475 |
| | 1162.400830000 | 0.929300000 | N2 | 1.00000320 | 107.883 |
| L111 | 261.100680000 | 20.383600000 | CaF2 | 1.55840983 | 98.431 |
| | 614.726380000AS | 0.867900000 | N2 | 1.00000320 | 93.917 |
| L112 | 359.575500000 | 7.168800000 | CaF2 | 1.55840983 | 89.668 |
| | 126.930570000 | 40.754900000 | N2 | 1.00000320 | 76.782 |
| L113 | −253.190760000 | 7.000000000 | NAF | 1.46483148 | 74.969 |
| | 132.038930000 | 28.180300000 | N2 | 1.00000320 | 67.606 |
| L114 | −338.990070000 | 7.611900000 | NAF | 1.46483148 | 67.535 |
| | 222.374240000 | 39.202700000 | N2 | 1.00000320 | 68.722 |
| L115 | −109.896940000 | 7.095700000 | NAF | 1.46483148 | 69.544 |
| | 705.107390000 | 19.428900000 | N2 | 1.00000320 | 84.312 |
| L116 | −706.158480000 | 29.677100000 | LIF | 1.47810153 | 90.890 |
| | −180.715990000 | 5.740400000 | N2 | 1.00000320 | 95.248 |
| L117 | 1725.475600000 | 35.904100000 | LIF | 1.47810153 | 112.495 |
| | −263.017160000 | 0.750000000 | N2 | 1.00000320 | 114.191 |
| L118 | 619.827930000 | 64.044600000 | LIF | 1.47810153 | 121.296 |
| | −197.026470000 | 0.750100000 | N2 | 1.00000320 | 121.844 |
| L119 | −195.861770000 | 7.000000000 | NAF | 1.46483148 | 121.626 |
| | −469.620100000 | 0.750000000 | N2 | 1.00000320 | 123.300 |
| | infinite | 0.750600000 | N2 | 1.00000320 | 122.405 |
| L120 | 640.893310000 | 25.458500000 | LIF | 1.47810153 | 123.549 |
| | −1089.937900000 | 0.980400000 | N2 | 1.00000320 | 123.525 |
| L121 | 322.108140000 | 34.102200000 | LIF | 1.47810153 | 121.602 |
| | −1728.500990000 | 31.928200000 | N2 | 1.00000320 | 120.573 |
| L122 | −234.494140000 | 46.273400000 | CaF2 | 1.55840983 | 119.587 |
| | −251.236960000 | 0.974700000 | N2 | 1.00000320 | 121.785 |
| L123 | 171.211410000 | 29.502800000 | LIF | 1.47810153 | 103.953 |
| | 452.301450000 | 0.887100000 | N2 | 1.00000320 | 101.542 |
| L124 | 126.180740000 | 28.831400000 | LIF | 1.47810153 | 88.565 |
| | 223.894010000 | 0.796800000 | N2 | 1.00000320 | 83.098 |
| L125 | 132.333150000 | 25.819300000 | LIF | 1.47810153 | 76.140 |
| | 477.745080000 | 6.457300000 | N2 | 1.00000320 | 70.847 |
| L126 | infinite | 59.682500000 | CaF2 | 1.55840983 | 69.261 |
| | infinite | 0.838600000 | N2 | 1.00000320 | 33.343 |
| L127 | infinite | 4.000000000 | CaF2 | 1.55840983 | 32.211 |
| | infinite | 12.000810000 | N2 | 1.00000320 | 29.804 |
| L128 | infinite | 0.000000000 | | | 13.603 |

ASPHERIC CONSTANTS

| | Asphere of Lens L103 | Asphere of Lens L104 | Asphere of Lens L106 | Asphere of Lens L111 |
|---|---|---|---|---|
| K | −0.8141 | −1.0887 | 4235.0115 | 0.0000 |
| C1 | −1.93290250e−007 | 1.57414760e−008 | 1.16160120e−007 | 1.35782560e−009 |
| C2 | 4.16659320e−011 | 1.63099500e−011 | −1.37360280e−011 | −2.31506660e−013 |
| C3 | −4.77885250e−015 | −4.85048550e−015 | −1.75181710e−016 | 2.14831120e−017 |
| C4 | 3.28605790e−019 | 9.48501060e−019 | 1.56917750e−019 | −7.84495330e−022 |
| C5 | −1.03537910e−022 | −2.37918310e−022 | −1.57135270e−023 | −4.23732680e−026 |
| C6 | 2.39743010e−026 | 3.60692700e−026 | 5.89614270e−028 | 1.17366430e−031 |
| C7 | 0.00000000e+000 | 0.00000000e+000 | 0.00000000e+000 | 0.00000000e+000 |
| C8 | 0.00000000e+000 | 0.00000000e+000 | 0.00000000e+000 | 0.00000000e+000 |
| C9 | 0.00000000e+000 | 0.00000000e+000 | 0.00000000e+000 | 0.00000000e+000 |

Refractive index and wavelength are referred to air.

TABLE 2

| M1159a LENSES | RADII | THICKNESSES | GLASSES | REFRACTIVE INDEX AT 248.38 nm | ½ FREE DIAMETER |
|---|---|---|---|---|---|
| 0 | infinite | 32.000000000 | Air | 0.99998200 | 54.410 |
| | infinite | 0.750000000 | Air | 0.99998200 | 61.498 |
| L201 | 359.203085922 | 16.544139898 | SIO2 | 1.50837298 | 62.894 |
| | −367.814285018 | 0.750000000 | Air | 0.99998200 | 63.342 |
| L202 | 376.906582229 | 16.424149202 | SIO2 | 1.50837298 | 63.744 |
| | −370.266896435 | 0.750000000 | Air | 0.99998200 | 63.552 |

TABLE 2-continued

| | | | | | |
|---|---|---|---|---|---|
| L203 | 623.868133301 | 12.000921336 | SIO2 | 1.50837298 | 62.201 |
| | -558.943539628 | 4.488271401 | Air | 0.99998200 | 61.489 |
| L204 | -593.881163796 | 10.597937240 | SIO2 | 1.50837298 | 60.233 |
| | -258.275165583AS | 1.300130829 | Air | 0.99998200 | 59.503 |
| L205 | -195.528496730AS | 7.000000000 | SIO2 | 1.50837298 | 59.067 |
| | 114.970814112 | 27.465616009 | Air | 0.99998200 | 54.855 |
| L206 | -150.593037892 | 7.000000000 | SIO2 | 1.50837298 | 55.023 |
| | 203.788990073 | 29.227930343 | Air | 0.99998200 | 59.359 |
| L207 | -116.847756998 | 7.000000015 | SIO2 | 1.50837298 | 60.888 |
| | -1029423.850607139AS | 26.431412586 | Air | 0.99998200 | 74.043 |
| L208 | -433.333706324 | 29.900058462 | SIO2 | 1.50837298 | 89.733 |
| | -145.855178517 | 0.750000000 | Air | 0.99998200 | 93.351 |
| L209 | -740.439232493AS | 44.983538148 | SIO2 | 1.50837298 | 108.655 |
| | -155.998681446 | 0.750000000 | Air | 0.99998200 | 111.280 |
| L210 | 730.369450038 | 38.596890643 | SIO2 | 1.50837298 | 120.834 |
| | -339.830855552 | 0.750000000 | Air | 0.99998200 | 121.150 |
| L211 | 159.417768241 | 52.577878183 | SIO2 | 1.50837298 | 112.765 |
| | 457732.591606731AS | 0.780542469 | Air | 0.99998200 | 110.299 |
| L212 | 190.812012094 | 23.738591831 | SIO2 | 1.50837298 | 94.787 |
| | 115.677643950 | 40.245663292 | Air | 0.99998200 | 77.717 |
| L213 | -412.140976525 | 7.000000000 | SIO2 | 1.50837298 | 76.256 |
| | 151.701098214 | 27.102188582 | Air | 0.99998200 | 69.619 |
| L214 | -319.487543080 | 7.000000000 | SIO2 | 1.50837298 | 69.443 |
| | 236.707933198 | 42.112032397 | Air | 0.99998200 | 70.193 |
| L215 | -105.934259216 | 8.769693914 | SIO2 | 1.50837298 | 71.068 |
| | 680.231460994 | 17.681829203 | Air | 0.99998200 | 88.650 |
| L216 | -517.056865132 | 36.235608441 | SIO2 | 1.50837298 | 91.923 |
| | -185.271735391 | 0.764865888 | Air | 0.99998200 | 100.651 |
| L217 | 2262.402798068 | 44.431825566 | SIO2 | 1.50837298 | 119.658 |
| | -267.329724617 | 8.198939895 | Air | 0.99998200 | 123.247 |
| L218 | 1103.186796189 | 40.827914599 | SIO2 | 1.50837298 | 133.839 |
| | -364.593909045 | 8.280602730 | Air | 0.99998200 | 134.570 |
| | infinite | -3.250000000 | Air | 0.99998200 | 133.180 |
| L219 | 620.770366318 | 25.036239346 | SIO2 | 1.50837298 | 134.241 |
| | -1858.943929157 | 0.750000000 | Air | 0.99998200 | 134.164 |
| L220 | 329.635686681 | 40.854820783 | SIO2 | 1.50837298 | 132.227 |
| | -1181.581276955 | 31.972595866 | Air | 0.99998200 | 131.156 |
| L221 | -249.799136729 | 10.000000000 | SIO2 | 1.50837298 | 130.229 |
| | 6484.262988004 | 5.619260320 | Air | 0.99998200 | 130.672 |
| L222 | -2574.687141000 | 38.775298966 | SIO2 | 1.50837298 | 130.696 |
| | -254.665255526 | 0.750000000 | Air | 0.99998200 | 130.891 |
| L223 | 203.341746230 | 25.409827006 | SIO2 | 1.50837298 | 110.728 |
| | 463.496973555 | 0.750000000 | Air | 0.99998200 | 108.517 |
| L224 | 118.263098967 | 37.247858671 | SIO2 | 1.50837298 | 92.529 |
| | 191.067427473 | 0.753637388 | Air | 0.99998200 | 84.037 |
| L225 | 137.671384625 | 24.859589811 | SIO2 | 1.50837298 | 78.934 |
| | 507.533271700 | 6.693359054 | Air | 0.99998200 | 74.624 |
| L226 | infinite | 55.768369688 | SIO2 | 1.50837298 | 72.833 |
| | infinite | 0.800000000 | Air | 0.99998200 | 35.729 |
| L227 | infinite | 4.000000000 | SIO2 | 1.50837298 | 34.512 |
| | infinite | 11.999970000 | Air | 0.99998200 | 31.851 |
| L228 | infinite | 0.000000000 | | 1.00000000 | 13.602 |

ASPHERIC CONSTANTS

| | Asphere of Lens L204 | Asphere of Lens L205 | Asphere of Lens L207 | Asphere of Lens L211 |
|---|---|---|---|---|
| K | -0.7780 | -0.4166 | -2116959451.7820 | 0.0000 |
| C1 | -1.91000417e-007 | 5.25344324e-008 | 1.25171476e-007 | 2.78321477e-009 |
| C2 | 4.02870297e-011 | 1.26756433e-011 | -1.53794245e-011 | 5.89866335e-014 |
| C3 | -5.55434626e-015 | -5.25489404e-015 | -3.12532578e-016 | 1.19811527e-017 |
| C4 | 1.68245178e-019 | 7.04023970e-019 | 2.00967035e-019 | -7.81165149e-022 |
| C5 | 2.20604311e-023 | -1.04520766e-022 | -2.05026124e-023 | 1.66111023e-026 |
| C6 | 8.09599744e-027 | 2.06454806e-026 | 7.81326379e-028 | -1.60965484e-031 |
| C7 | 0.00000000e+000 | 0.00000000e+000 | 0.00000000e+000 | 0.00000000e+000 |
| C8 | 0.00000000e+000 | 0.00000000e+000 | 0.00000000e+000 | 0.00000000e+000 |
| C9 | 0.00000000e+000 | 0.00000000e+000 | 0.00000000e+000 | 0.00000000e+000 |

Refractive index and wavelength were determined in air.

TABLE 3

| M1222a LENSES | RADII | THICKNESSES | GLASSES | REFRACTIVE INDEX AT 243.380 nm | ½ FREE DIAMETER |
|---|---|---|---|---|---|
| 0 | infinite | 32.000000000 | L710 | | 54.410 |
| | infinite | 0.750000000 | L710 | | 62.206 |

TABLE 3-continued

| | | | | | |
|---|---|---|---|---|---|
| L301 | 12444.588054076 | 17.524945114 | SIO2 | 1.50837298 | 62.427 |
| | −167.739069307 | 0.765384867 | L710 | 0.99998200 | 63.213 |
| L302 | 1202.845295516 | 8.943027554 | SIO2 | 1.50837298 | 63.724 |
| | −1004.036633539 | 0.757676170 | L710 | 0.99998200 | 63.750 |
| L303 | 235.865591780 | 9.298971429 | SIO2 | 1.50837298 | 63.464 |
| | 231.568686620 | 24.888929767 | L710 | 0.99998200 | 62.457 |
| L304 | −148.910928631 | 11.307968350 | SIO2 | 1.50837298 | 62.393 |
| | −106.056725042AS | 11.531057240 | L710 | 0.99998200 | 63.087 |
| L305 | −135.467082619AS | 7.000000000 | SIO2 | 1.50837298 | 60.496 |
| | 236.063635384 | 11.820516442 | L710 | 0.99998200 | 61.104 |
| L306 | −1613.154189634 | 7.000000000 | SIO2 | 1.50837298 | 61.565 |
| | 222.732790977 | 38.103480975 | L710 | 0.99998200 | 63.842 |
| L307 | −93.477889742 | 7.004909948 | SIO2 | 1.50837298 | 64.855 |
| | 10625258.126273967AS | 25.183324680 | L710 | 0.99998200 | 84.949 |
| L308 | −313.395232213 | 37.921288357 | SIO2 | 1.50837298 | 94.853 |
| | −140.728421777 | 2.422311655 | L710 | 0.99998200 | 102.129 |
| L309 | −882.714069478AS | 62.983288381 | SIO2 | 1.50837298 | 129.319 |
| | −162.454752849 | 0.750000000 | L710 | 0.99998200 | 131.820 |
| L310 | 372.954030958 | 61.566328910 | SIO2 | 1.50837298 | 148.956 |
| | −446.221051696 | 0.750000000 | L710 | 0.99998200 | 148.766 |
| L311 | 159.626550846 | 68.423222152 | SIO2 | 1.50837298 | 126.219 |
| | 6881.817080351AS | 0.754846049 | L710 | 0.99998200 | 121.302 |
| L312 | 1035.238560782 | 11.490813397 | SIO2 | 1.50837298 | 116.908 |
| | 181.491627420 | 22.008897360 | L710 | 0.99998200 | 97.838 |
| L313 | 508.638145894 | 7.024491847 | SIO2 | 1.50837298 | 96.444 |
| | 144.727315074 | 42.480962349 | L710 | 0.99998200 | 85.818 |
| L314 | −315.769132147 | 7.000000000 | SIO2 | 1.50837298 | 85.132 |
| | 168.042488686AS | 60.840114041 | L710 | 0.99998200 | 82.384 |
| L315 | −110.641058959 | 7.000000000 | SIO2 | 1.50837298 | 82.821 |
| | 460.993264759 | 26.383956624 | L710 | 0.99998200 | 108.073 |
| L316 | −573.887503383 | 33.664255268 | SIO2 | 1.50837298 | 111.503 |
| | −189.203245467 | 0.750000000 | L710 | 0.99998200 | 115.508 |
| L317 | −4374.531790288 | 33.200388364 | SIO2 | 1.50837298 | 144.129 |
| | −365.840916872 | 0.750000000 | L710 | 0.99998200 | 146.400 |
| L318 | 5367.437754044 | 32.001020330 | SIO2 | 1.50837298 | 162.024 |
| | −556.194479444 | 0.857496674 | L710 | 0.99998200 | 163.414 |
| L319 | 1425.923295786 | 68.540751990 | SIO2 | 1.50837298 | 172.847 |
| | −318.608860176 | 8.280602730 | L710 | 0.99998200 | 173.674 |
| | infinite | −3.250000000 | L710 | 0.99998200 | 165.236 |
| L320 | 524.088279104 | 18.000000000 | SIO2 | 1.50837298 | 164.278 |
| | 896.107746530 | 0.750000000 | L710 | 0.99998200 | 163.371 |
| L321 | 447.468508944 | 50.493798307 | SIO2 | 1.50837298 | 161.574 |
| | −849.886554129 | 37.700767601 | L710 | 0.99998200 | 160.560 |
| L322 | −277.232722440 | 15.000000000 | SIO2 | 1.50837298 | 159.396 |
| | −359.067701243AS | 13.800352685 | L710 | 0.99998200 | 159.582 |
| L323 | −283.705002828AS | 20.143173981 | SIO2 | 1.50837298 | 158.903 |
| | −264.293409160 | 0.750000000 | L710 | 0.99998200 | 159.923 |
| L324 | 182.924856302 | 28.086938401 | SIO2 | 1.50837298 | 124.917 |
| | 293.542915952 | 0.750000000 | L710 | 0.99998200 | 122.142 |
| L325 | 138.051507251 | 29.667601165 | SIO2 | 1.50837298 | 107.973 |
| | 206.495592035 | 4.518697859 | L710 | 0.99998200 | 103.815 |
| L326 | 137.608373914 | 37.703252491 | SIO2 | 1.50837298 | 93.164 |
| | 2008.206929102AS | 6.230615100 | L710 | 0.99998200 | 88.838 |
| L327 | 79833.713358573 | 27.734587521 | SIO2 | 1.50837298 | 83.516 |
| | infinite | 5.000000000 | L710 | 0.99998200 | 62.961 |
| L328 | infinite | 25.000000000 | SIO2 | 1.50837298 | 52.694 |
| | infinite | 10.000000000 | L710 | 0.99998200 | 34.137 |
| L329 | infinite | 0.000000000 | | | 13.605 |

ASPHERIC CONSTANTS

| | Asphere of Lens L304 | Asphere of Lens L305 | Asphere of Lens L307 | Asphere of Lens L311 |
|---|---|---|---|---|
| K | −1.5058 | −1.3497 | −23427671857767355000000000000.0000 | 0.0000 |
| C1 | −1.86740544e−007 | 9.59200710e−008 | 1.13856265e−007 | 1.36987424e−008 |
| C2 | 3.71500406e−011 | 3.31187872e−011 | −9.18910043e−012 | −6.69820602e−013 |
| C3 | −8.38153156e−015 | −1.02270060e−014 | −2.09482944e−016 | 2.24912373e−017 |
| C4 | 1.06034402e−018 | 1.45048880e−018 | 8.75414269e−020 | −5.16548278e−022 |
| C5 | −7.88993246e−023 | −1.18276835e−022 | −6.71659158e−024 | 4.05832389e−027 |
| C6 | 2.81358334e−027 | 5.49446108e−027 | 1.94896163e−028 | 3.25008659e−032 |
| C7 | 0.00000000e+000 | 0.00000000e+000 | 0.00000000e+000 | 0.00000000e+000 |
| C8 | 0.00000000e+000 | 0.00000000e+000 | 0.00000000e+000 | 0.00000000e+000 |
| C9 | 0.00000000e+000 | 0.00000000e+000 | 0.00000000e+000 | 0.00000000e+000 |

| | Asphere of Lens L314 | Asphere of Lens L322 | Asphere of Lens L323 | Asphere of Lens L326 |
|---|---|---|---|---|
| K | 0.0000 | 0.0000 | 0.0000 | 0.0000 |
| C1 | −3.81602557e−009 | 2.20018047e−011 | 2.59747415e−011 | 2.53574810e−008 |
| C2 | −1.32998252e−012 | −6.06720907e−016 | 1.15845870e−015 | 1.14136997e−012 |

TABLE 3-continued

| | | | |
|---|---|---|---|
| C3 | 0.00000000e+000 | −1.85544385e−019 | 2.93792021e−019 | −2.09898773e−016 |
| C4 | −3.24422613e−021 | 1.99332533e−023 | −5.20753147e−024 | 1.80771983e−020 |
| C5 | 3.55600124e−025 | −1.25615823e−028 | 5.15087863e−028 | −8.70458993e−025 |
| C6 | −2.11130790e−029 | 5.72017494e−033 | −3.68361393e−033 | 1.83743606e−029 |
| C7 | 0.00000000e+000 | 0.00000000e+000 | 0.00000000e+000 | 0.00000000e+000 |
| C8 | 0.00000000e+000 | 0.00000000e+000 | 0.00000000e+000 | 0.00000000e+000 |
| C9 | 0.00000000e+000 | 0.00000000e+000 | 0.00000000e+000 | 0.00000000e+000 |

L710 = Air at 710 Torr

TABLE 4

| M1450a LENSES | RADII | THICKNESSES | GLASSES | REFRACTIVE INDEX AT 193.304 nm | ½ FREE DIAMETER |
|---|---|---|---|---|---|
| 0 | infinite | 32.000000000 | L710 | 0.99998200 | 54.410 |
|  | infinite | 0.700000000 | L710 | 0.99998200 | 61.369 |
| L401 | 1072.135967906AS | 17.638366552 | SIO2 | 1.56028895 | 62.176 |
|  | −274.850778792 | 10.038841436 | HE | 0.99971200 | 62.804 |
| L402 | −195.160258125 | 9.677862773 | SIO2 | 1.56028895 | 62.822 |
|  | −159.034954419 | 15.411706951 | HE | 0.99971200 | 63.649 |
| L403 | −409.040910955 | 11.634800854 | SIO2 | 1.56028895 | 62.424 |
|  | −184.929247238 | 18.878098976 | HE | 0.99971200 | 62.549 |
| L404 | −86.928681017 | 9.000000000 | SIO2 | 1.56028895 | 61.870 |
|  | −81.003682870AS | 3.559685814 | HE | 0.99971200 | 63.469 |
| L405 | −105.055795110AS | 6.000000000 | SIO2 | 1.56028895 | 60.375 |
|  | −237.059668556 | 7.135710642 | HE | 0.99971200 | 61.325 |
| L406 | −170.390902140 | 6.000000000 | SIO2 | 1.56028895 | 61.152 |
|  | 179.617978310 | 40.187039625 | HE | 0.99971200 | 64.312 |
| L407 | −108.910057000 | 6.000000000 | SIO2 | 1.56028895 | 66.769 |
|  | 10000.000000000AS | 23.032466424 | HE | 0.99971200 | 84.010 |
| L408 | −482.423484275 | 35.657870541 | SIO2 | 1.56028895 | 98.271 |
|  | −166.024534852 | 0.712083613 | HE | 0.99971200 | 104.636 |
| L409 | −5301.825985682AS | 59.184134830 | SIO2 | 1.56028895 | 129.868 |
|  | −219.603781546 | 1.964238192 | HE | 0.99971200 | 135.616 |
| L410 | −407.514819861 | 25.000000000 | SIO2 | 1.56028895 | 141.192 |
|  | −275.650807138 | 2.073256156 | HE | 0.99971200 | 143.933 |
| L411 | 812.482278880 | 41.728126549 | SIO2 | 1.56028895 | 150.437 |
|  | 2085.321083022 | 11.867512800 | HE | 0.99971200 | 150.588 |
| L412 | 1989.395979432 | 66.189720990 | SIO2 | 1.56028895 | 151.170 |
|  | −336.825131023 | 2.208063283 | HE | 0.99971200 | 151.249 |
| L413 | 161.751335222 | 66.140524993 | SIO2 | 1.56028895 | 121.860 |
|  | −7743.125302019AS | 0.732008617 | HE | 0.99971200 | 115.257 |
| L414 | 2700.830058670 | 8.000000000 | SIO2 | 1.56028895 | 112.928 |
|  | 175.482298866 | 18.681794864 | HE | 0.99971200 | 94.204 |
| L415 | 330.479176880 | 8.000000000 | SIO2 | 1.56028895 | 91.933 |
|  | 215.492418517 | 37.734500801 | HE | 0.99971200 | 86.259 |
| L416 | −263.077268094 | 6.000000000 | SIO2 | 1.56028895 | 83.596 |
|  | 119.453498304AS | 66.406324570 | HE | 0.99971200 | 77.915 |
| L417 | −126.431526615 | 6.000000000 | SIO2 | 1.56028895 | 80.395 |
|  | 1627.715124622 | 24.178532080 | HE | 0.99971200 | 96.410 |
| L418 | −517.066851877 | 30.987035837 | SIO2 | 1.56028895 | 105.371 |
|  | −242.666474401 | 0.700000000 | HE | 0.99971200 | 113.249 |
| L419 | −737.673536297 | 30.292644418 | SIO2 | 1.56028895 | 124.350 |
|  | −270.925750340 | 0.700000000 | HE | 0.99971200 | 128.112 |
| L420 | −1051.979110054 | 27.301344542 | SIO2 | 1.56028895 | 137.231 |
|  | −363.545320262 | 0.711035404 | HE | 0.99971200 | 139.644 |
| L421 | 914.456821676 | 50.497126159 | SIO2 | 1.56028895 | 148.531 |
|  | −500.741001160 | 10.000000000 | HE | 0.99971200 | 149.700 |
| L422 | infinite | −5.000000000 | HE | 0.99971200 | 146.693 |
|  | 353.826401507AS | 22.748234242 | SIO2 | 1.56028895 | 147.721 |
| L423 | 529.864238000 | 1.376970242 | HE | 0.99971200 | 146.294 |
|  | 422.718681400 | 57.709521396 | SIO2 | 1.56028895 | 146.003 |
| L424 | −733.506899438 | 37.321473463 | HE | 0.99971200 | 143.238 |
|  | −261.264462802 | 15.000000000 | SIO2 | 1.56028895 | 138.711 |
| L425 | −292.145870649AS | 18.942285163 | HE | 0.99971200 | 139.089 |
|  | −225.638240671AS | 19.098948274 | SIO2 | 1.56028895 | 136.464 |
| L426 | −230.537827019 | 0.700000000 | HE | 0.99971200 | 138.299 |
|  | 246.284141218 | 23.038665896 | SIO2 | 1.56028895 | 114.892 |
| L427 | 400.381469987 | 0.704537226 | HE | 0.99971200 | 110.931 |
|  | 131.458744675 | 28.653621426 | SIO2 | 1.56028895 | 98.090 |
| L428 | 200.500973816 | 0.708148286 | HE | 0.99971200 | 93.130 |
|  | 139.428371855 | 36.540725215 | SIO2 | 1.56028895 | 87.103 |
| L429 | 1188.104646109AS | 8.107454155 | HE | 0.99971200 | 79.764 |
|  | infinite | 25.934594077 | CaF2 | 1.50143563 | 72.791 |
| L430 | infinite | 5.000000000 | L710 | 0.99998200 | 54.980 |
|  | infinite | 25.000000000 | CAF2HL | 1.50143563 | 46.911 |

TABLE 4-continued

| L431 | infinite | 10.000000000 | L710 | 0.99998200 | 29.741 |
| | infinite | 0.000000000 | | | 13.603 |

ASPHERIC CONSTANTS

| | Asphere of Lens L401 | Asphere of Lens L404 | Asphere of Lens L405 | Asphere of Lens L407 |
|---|---|---|---|---|
| K | 0.0000 | −1.3306 | −1.1682 | 0.0000 |
| C1 | 7.64628377e−008 | −2.46704917e−007 | 8.44108642e−008 | 8.18369639e−008 |
| C2 | 6.87967706e−013 | 1.00943626e−011 | 6.67934072e−012 | −9.75131236e−012 |
| C3 | 6.32367166e−017 | −6.88338440e−015 | −5.16053049e−015 | 3.85197305e−016 |
| C4 | 4.65534082e−020 | 1.00927351e−018 | 8.51835178e−019 | 1.05024918e−020 |
| C5 | −1.74760583e−023 | −1.37371749e−022 | −9.37525700e−023 | −3.84907914e−024 |
| C6 | 3.25143184e−027 | 9.94732480e−027 | 3.80738193e−027 | 3.28329458e−028 |
| C7 | −2.97366674e−031 | −6.46127195e−031 | −7.58518933e−035 | −1.16692413e−032 |
| C8 | 0.00000000e+000 | 0.00000000e+000 | 0.00000000e+000 | 0.00000000e+000 |
| C9 | 0.00000000e+000 | 0.00000000e+000 | 0.00000000e+000 | 0.00000000e+000 |

| | Asphere of Lens L409 | Asphere of Lens L413 | Asphere of Lens L416 | Asphere of Lens L421 |
|---|---|---|---|---|
| K | 0.0000 | 0.0000 | 0.0000 | −0.0073 |
| C1 | 4.21547093e−009 | 1.39800416e−008 | −1.87949694e−008 | 1.63581145e−010 |
| C2 | −2.05810358e−013 | −1.91505190e−013 | −4.88119675e−012 | −7.80915457e−015 |
| C3 | −2.19266732e−018 | −1.26782008e−017 | −5.90009367e−017 | 6.72460331e−021 |
| C4 | −7.83959176e−023 | 9.93778200e−022 | −5.76749530e−021 | 5.33479719e−025 |
| C5 | 6.55613544e−027 | −5.55824342e−026 | −3.07189672e−025 | 2.82144185e−028 |
| C6 | −7.33103571e−032 | 1.85230750e−030 | 4.51160541e−029 | −6.16219372e−033 |
| C7 | −2.15461419e−036 | −2.83026055e−035 | −5.02037364e−033 | 2.37157562e−037 |
| C8 | 0.00000000e+000 | 0.00000000e+000 | 0.00000000e+000 | 0.00000000e+000 |
| C9 | 0.00000000e+000 | 0.00000000e+000 | 0.00000000e+000 | 0.00000000e+000 |

| | Asphere of Lens L424 | Asphere of Lens L425 | Asphere of Lens L428 |
|---|---|---|---|
| K | 0.0000 | 0.0000 | 0.0000 |
| C1 | 1.28367898e−010 | −2.31584329e−010 | 2.79193914e−008 |
| C2 | −1.18938455e−014 | 2.47013162e−014 | 5.72325985e−013 |
| C3 | −1.84714219e−019 | 1.13928751e−018 | −1.69156262e−016 |
| C4 | 4.28587779e−023 | −1.24997826e−023 | 1.45062961e−020 |
| C5 | −1.39213579e−027 | −9.59653919e−028 | −7.24157687e−025 |
| C6 | 2.04883718e−032 | 1.46403755e−032 | 1.59130857e−029 |
| C7 | −3.36201584e−037 | −1.23684921e−037 | 9.07975701e−035 |
| C8 | 0.00000000e+000 | 0.00000000e+000 | 0.00000000e+000 |
| C9 | 0.00000000e+000 | 0.00000000e+000 | 0.00000000e+000 |

L710 = Air at 710 Torr

TABLE 5

M1558a

| LENSES | RADII | THICKNESSES | GLASSES | EFRACTIVE INDEX AT 193.304 nm | 1/2 FREE DIAMETER |
|---|---|---|---|---|---|
| 0 | infinite | 32.000000000 | L710 | 0.99998200 | 54.410 |
| | infinite | 0.700000000 | L710 | 0.99998200 | 61.800 |
| L501 | 1062.826934956AS | 17.734965551 | SIO2 | 1.56028895 | 62.680 |
| | −280.649155373 | 9.921059017 | HE | 0.99971200 | 63.358 |
| L502 | −198.612797944 | 9.733545477 | SIO2 | 1.56028895 | 63.454 |
| | −157.546275141 | 15.417407860 | HE | 0.99971200 | 64.281 |
| L503 | −400.277413338 | 11.803054495 | SIO2 | 1.56028895 | 63.163 |
| | −182.515287485 | 19.059582585 | HE | 0.99971200 | 63.316 |
| L504 | −86.486413985 | 9.000000000 | SIO2 | 1.56028895 | 62.723 |
| | −79.976798205AS | 3.314115561 | HE | 0.99971200 | 64.356 |
| L505 | −102.262183494AS | 6.000000000 | SIO2 | 1.56028895 | 61.260 |
| | −275.242312561 | 7.844485351 | HE | 0.99971200 | 62.494 |
| L506 | −191.274205909 | 6.000000000 | SIO2 | 1.56028895 | 62.450 |
| | 180.723494008 | 40.175681177 | HE | 0.99971200 | 65.811 |
| L507 | −108.539011643 | 6.000000000 | SIO2 | 1.56028895 | 67.752 |
| | 10000.000000000AS | 23.009626916 | HE | 0.99971200 | 86.379 |
| L508 | −481.040730284 | 35.657298256 | SIO2 | 1.56028895 | 100.931 |
| | −165.828518942 | 0.700000000 | HE | 0.99971200 | 106.719 |
| L509 | −5243.952853546AS | 59.233771719 | SIO2 | 1.56028895 | 134.666 |
| | −218.541408733 | 2.123657562 | HE | 0.99971200 | 139.441 |
| L510 | −402.136827778 | 25.000000000 | SIO2 | 1.56028895 | 145.856 |
| | −276.854279724 | 1.637353303 | HE | 0.99971200 | 148.618 |
| L511 | 796.304534481 | 36.805305429 | SIO2 | 1.56028895 | 156.741 |
| | 2360.950907095 | 10.808883416 | HE | 0.99971200 | 157.059 |

TABLE 5-continued

| | | | | | |
|---|---|---|---|---|---|
| L512 | 2256.926430541 | 60.789786196 | SIO2 | 1.56028895 | 157.684 |
| | −336.450738373 | 0.801676910 | HE | 0.99971200 | 157.856 |
| L513 | 161.617552542 | 66.152351274 | SIO2 | 1.56028895 | 125.624 |
| | −6835.350709889AS | 0.744366824 | HE | 0.99971200 | 121.362 |
| L514 | 2851.162473443 | 8.000000000 | SIO2 | 1.56028895 | 118.726 |
| | 173.208226906 | 18.750820117 | HE | 0.99971200 | 97.559 |
| L515 | 318.351302869 | 8.000000000 | SIO2 | 1.56028895 | 95.703 |
| | 214.643166184 | 38.151364608 | HE | 0.99971200 | 89.760 |
| L516 | −261.549915460 | 6.000000000 | SIO2 | 1.56028895 | 88.331 |
| | 119.510683982AS | 66.550546342 | HE | 0.99971200 | 82.116 |
| L517 | −126.322271364 | 6.000000000 | SIO2 | 1.56028895 | 83.464 |
| | 1722.207555551 | 24.185704173 | HE | 0.99971200 | 102.415 |
| L518 | −506.819064828 | 30.988960270 | SIO2 | 1.56028895 | 111.113 |
| | −242.042046428 | 0.700000000 | HE | 0.99971200 | 118.861 |
| L519 | −728.789614455 | 30.297084361 | SIO2 | 1.56028895 | 132.704 |
| | −269.518093553 | 0.700000000 | HE | 0.99971200 | 135.576 |
| L520 | −1024.754284774 | 27.306923440 | SIO2 | 1.56028895 | 147.201 |
| | −361.037355343 | 0.700000000 | HE | 0.99971200 | 149.061 |
| L521 | 929.096482269 | 49.082091976 | SIO2 | 1.56028895 | 161.109 |
| | −497.886578908 | 15.000000000 | HE | 0.99971200 | 161.854 |
| | infinite | −10.000000000 | HE | 0.99971200 | 158.597 |
| L522 | 352.973470359AS | 22.735479730 | SIO2 | 1.56028895 | 159.957 |
| | 529.864238000 | 1.119499649 | HE | 0.99971200 | 158.688 |
| L523 | 422.718681400 | 57.532074113 | SIO2 | 1.56028895 | 158.278 |
| | −733.230538894 | 37.317449332 | HE | 0.99971200 | 156.533 |
| L524 | −261.165349728 | 15.000000000 | SIO2 | 1.56028895 | 155.119 |
| | −292.119447959AS | 18.962883498 | HE | 0.99971200 | 156.043 |
| L525 | −226.263316842AS | 19.009003051 | SIO2 | 1.56028895 | 155.000 |
| | −231.163516914 | 0.700000000 | HE | 0.99971200 | 157.710 |
| L526 | 245.306778718 | 23.024380018 | SIO2 | 1.56028895 | 124.547 |
| | 403.694577141 | 0.700000000 | HE | 0.99971200 | 121.262 |
| L527 | 132.188567375 | 28.647981266 | SIO2 | 1.56028895 | 104.696 |
| | 199.679919884 | 0.700019350 | HE | 0.99971200 | 101.254 |
| L528 | 138.967602414 | 36.537553325 | SIO2 | 1.56028895 | 93.617 |
| | 1194.093826692AS | 8.108769689 | HE | 0.99971200 | 89.148 |
| L529 | infinite | 25.923824338 | CaF2 | 1.50143563 | 82.715 |
| | infinite | 5.000000000 | L710 | 0.99998200 | 63.301 |
| L530 | infinite | 25.000000000 | CaF2 | 1.50143563 | 52.976 |
| | infinite | 10.000000000 | L710 | 0.99998200 | 34.253 |
| L531 | infinite | 0.000000000 | | | 13.603 |

L710 = Air at 710 Torr
ASPHERIC CONSTANTS
Asphere of Lens L501
K        0.0000
C1       7.79889739e−008
C2       5.96475035e−013
C3       5.73397945e−017
C4       5.38600405e−020
C5       −2.08145188e−023
C6       4.05094979e−027
C7       −3.79132983e−031
C8       0.00000000e+000
C9       0.00000000e+000
Asphere of Lens L504
K        −1.3308
C1       −2.46633450e−007
C2       1.00446806e−011
C3       −7.00686898e−015
C4       9.90840734e−019
C5       −1.31781718e−022
C6       9.28901869e−027
C7       −6.52628587e−031
C8       0.00000000e+000
C9       0.00000000e+000
Asphere of Lens L505
K        −1.1513
C1       8.27765089e−008
C2       7.00992841e−012
C3       −5.19825762e−015
C4       8.12467102e−019
C5       −8.31805913e−023
C6       2.18925711e−027
C7       1.11778799e−031
C8       0.00000000e+000
C9       0.00000000e+000
Asphere of Lens L507
K        0.0000
C1       8.22829380e−008

TABLE 5-continued

| | |
|---|---|
| C2 | −9.72735758e−012 |
| C3 | 3.85643753e−016 |
| C4 | 1.01114314e−020 |
| 05 | −3.91221853e−024 |
| C6 | 3.39732781e−028 |
| C7 | −1.20135313e−032 |
| C8 | 0.00000000e+000 |
| C9 | 0.00000000e+000 |
| Asphere of Lens L509 | |
| K | 0.0000 |
| C1 | 4.14637283e−009 |
| C2 | −2.13253257e−013 |
| C3 | −2.08003643e−018 |
| C4 | −7.83152213e−023 |
| C5 | 5.30015388e−027 |
| C6 | −2.59321154e−033 |
| C7 | −3.37000758e−036 |
| C8 | 0.00000000e+000 |
| C9 | 0.00000000e+000 |
| Asphere of Lens L513 | |
| K | 0.0000 |
| C1 | 1.39567662e−008 |
| C2 | −2.05760928e−013 |
| C3 | −1.29919990e−017 |
| C4 | 1.00302455e−021 |
| C5 | −5.58828742e−026 |
| C6 | 1.79594589e−030 |
| C7 | −2.49374487e−035 |
| C8 | 0.00000000e+000 |
| C9 | 0.00000000e+000 |
| Asphere of Lens L516 | |
| K | 0.0000 |
| C1 | −1.82058286e−008 |
| C2 | −4.87410470e−012 |
| C3 | −5.89919068e−017 |
| C4 | −4.04061992e−021 |
| C5 | −6.60202054e−025 |
| C6 | 9.31855676e−029 |
| C7 | −7.48573635e−033 |
| C8 | 0.00000000e+000 |
| C9 | 0.00000000e+000 |
| Asphere of Lens L522 | |
| K | −0.0071 |
| C1 | 1.64455895e−010 |
| C2 | −7.76483415e−015 |
| C3 | 8.29256873e−021 |
| C4 | −5.46990406e−025 |
| C5 | 3.42070772e−028 |
| C6 | −8.24545949e−033 |
| C7 | 2.57783363e−037 |
| C8 | 0.00000000e+000 |
| C9 | 0.00000000e+000 |
| Asphere of Lens L524 | |
| K | 0.0000 |
| C1 | 1.18780021e−010 |
| C2 | −1.18823445e−014 |
| C3 | −1.80162246e−019 |
| C4 | 4.08343213e−023 |
| C5 | −1.42735407e−027 |
| C6 | 2.34804331e−032 |
| C7 | −3.79018523e−037 |
| C8 | 0.00000000e+000 |
| C9 | 0.00000000e+000 |
| Asphere of Lens L525 | |
| K | 0.0000 |
| C1 | −2.15560895e−010 |
| C2 | 2.44929281e−014 |
| C3 | 1.12359306e−018 |
| C4 | −1.29749910e−023 |
| C5 | −1.00106399e−027 |
| C6 | 1.88165471e−032 |
| C7 | −2.01557723e−037 |
| C8 | 0.00000000e+000 |
| C9 | 0.00000000e+000 |
| Asphere of Lens L528 | |
| K | 0.0000 |
| C1 | 2.73896476e−008 |
| C2 | 6.17281255e−013 |
| C3 | −1.75474902e−016 |

TABLE 5-continued

| | |
|---|---|
| C4 | 1.56329449e−020 |
| C5 | −8.82259694e−025 |
| C6 | 2.92948124e−029 |
| C7 | −4.01055770e−034 |
| C8 | 0.00000000e+000 |
| C9 | 0.00000000e+000 |

TABLE 6

M1587a

| LENSES | RADII | THICKNESSES | GLASSES | EFRACTIVE INDEX AT 157.629 nm | 1/2 FREE DIAMETER |
|---|---|---|---|---|---|
| 0 | infinite | 27.171475840 | N2 | 1.00031429 | 46.200 |
| | infinite | 0.602670797 | N2 | 1.00031429 | 52.673 |
| L601 | 900.198243311AS | 15.151284556 | CaF2 | 1.55929035 | 53.454 |
| | −235.121108435 | 9.531971079 | N2 | 1.00031429 | 54.049 |
| L602 | −167.185917779 | 8.294716452 | CaF2 | 1.55929035 | 54.178 |
| | −132.673519510 | 14.020355779 | N2 | 1.00031429 | 54.901 |
| L603 | −333.194588652 | 9.893809820 | CaF2 | 1.55929035 | 53.988 |
| | −155.450516203 | 15.930502944 | N2 | 1.00031429 | 54.132 |
| L604 | −73.572316296 | 7.641977580 | CaF2 | 1.55929035 | 53.748 |
| | −68.248613899AS | 2.881720302 | N2 | 1.00031429 | 55.167 |
| L605 | −86.993585564AS | 5.094651720 | CaF2 | 1.55929035 | 52.580 |
| | −238.150965327 | 5.379130780 | N2 | 1.00031429 | 53.729 |
| L606 | −165.613920870 | 5.094651720 | CaF2 | 1.55929035 | 53.730 |
| | 153.417884485 | 34.150169591 | N2 | 1.00031429 | 56.762 |
| L607 | −92.061009990 | 5.094651720 | CaF2 | 1.55929035 | 58.081 |
| | 8491.086261873AS | 19.673523795 | N2 | 1.00031429 | 74.689 |
| L608 | −407.131300451 | 30.380807138 | CaF2 | 1.55929035 | 87.291 |
| | −140.620317156 | 0.761662684 | N2 | 1.00031429 | 91.858 |
| L609 | −4831.804853654AS | 50.269660218 | CaF2 | 1.55929035 | 117.436 |
| | −192.197373609 | 1.688916911 | N2 | 1.00031429 | 121.408 |
| L610 | −367.718684892 | 21.227715500 | CaF2 | 1.55929035 | 127.704 |
| | −233.628547894 | 2.224071019 | N2 | 1.00031429 | 129.305 |
| L611 | 709.585855080 | 28.736922725 | CaF2 | 1.55929035 | 137.016 |
| | 1238.859445357 | 9.120684720 | N2 | 1.00031429 | 137.428 |
| L612 | 1205.457051945 | 49.281218258 | CaF2 | 1.55929035 | 138.288 |
| | −285.321880705 | 1.625271224 | N2 | 1.00031429 | 138.379 |
| L613 | 137.549591710 | 56.718543740 | CaF2 | 1.55929035 | 108.652 |
| | −4380.301012978AS | 0.623523902 | N2 | 1.00031429 | 106.138 |
| L614 | 2663.880214408 | 6.792868960 | CaF2 | 1.55929035 | 103.602 |
| | 149.184979730 | 15.779049257 | N2 | 1.00031429 | 84.589 |
| L615 | 281.093108064 | 6.792868960 | CaF2 | 1.55929035 | 83.373 |
| | 184.030288413 | 32.341552355 | N2 | 1.00031429 | 77.968 |
| L616 | −222.157416308 | 5.094651720 | CaF2 | 1.55929035 | 77.463 |
| | 101.254238115AS | 56.792834221 | N2 | 1.00031429 | 71.826 |
| L617 | −106.980638018 | 5.094651720 | CaF2 | 1.55929035 | 72.237 |
| | 1612.305471130 | 20.581065398 | N2 | 1.00031429 | 89.760 |
| L618 | −415.596135628 | 26.398111993 | CaF2 | 1.55929035 | 96.803 |
| | −204.680044631 | 0.713343960 | N2 | 1.00031429 | 103.409 |
| L619 | −646.696622394 | 25.867340760 | CaF2 | 1.55929035 | 116.636 |
| | −231.917626896 | 0.766268682 | N2 | 1.00031429 | 118.569 |
| L620 | −790.657607677 | 23.400482872 | CaF2 | 1.55929035 | 128.806 |
| | −294.872053725 | 0.721402031 | N2 | 1.00031429 | 130.074 |
| L621 | 786.625567756 | 40.932308205 | CaF2 | 1.55929035 | 141.705 |
| | −431.247283013 | 12.736629300 | N2 | 1.00031429 | 142.089 |
| | infinite | −8.491086200 | N2 | 1.00031429 | 134.586 |
| L622 | 295.022653593AS | 20.185109438 | CaF2 | 1.55929035 | 139.341 |
| | 449.912291916 | 0.619840486 | N2 | 1.00031429 | 137.916 |
| L623 | 358.934076212 | 48.662890509 | CaF2 | 1.55929035 | 136.936 |
| | −622.662988878 | 30.955714157 | N2 | 1.00031429 | 135.288 |
| L624 | −224.404889753 | 12.736629300 | CaF2 | 1.55929035 | 134.760 |
| | −251.154571510AS | 16.079850229 | N2 | 1.00031429 | 134.853 |
| L625 | −193.582989843AS | 16.510083506 | CaF2 | 1.55929035 | 134.101 |
| | −198.077570749 | 0.880353872 | N2 | 1.00031429 | 136.109 |
| L626 | 206.241795157 | 19.927993542 | CaF2 | 1.55929035 | 101.240 |
| | 338.140581666 | 0.925956949 | N2 | 1.00031429 | 97.594 |
| L627 | 111.017549581 | 24.580089962 | CaF2 | 1.55929035 | 85.023 |
| | 169.576109839 | 0.777849447 | N2 | 1.00031429 | 81.164 |
| L628 | 117.982165264 | 31.161065630 | CaF2 | 1.55929035 | 75.464 |
| | 921.219058213AS | 6.934980174 | N2 | 1.00031429 | 69.501 |
| L629 | infinite | 22.260797322 | CaF2 | 1.55929035 | 63.637 |
| | infinite | 4.245543100 | N2 | 1.00031429 | 48.606 |
| L630 | infinite | 21.227715500 | CaF2 | 1.55929035 | 41.032 |
| | infinite | 8.491086200 | N2 | 1.00031429 | 26.698 |

TABLE 6-continued

| | | | | |
|---|---|---|---|---|
| infinite | 0.000000000 | | 1.00000000 | 11.550 |

Wavelength and refractive index are given referred to Vacuum.
ASPHERIC CONSTANTS
Asphere of Lens L601
K        0.0000
C1       1.28594437e−007
C2       8.50731836e−013
C3       1.16375620e−016
C4       2.28674275e−019
C5       −1.23202729e−022
C6       3.32056239e−026
C7       −4.28323389e−030
C8       0.00000000e+000
C9       0.00000000e+000
Asphere of Lens L604
K        −1.3312
C1       −4.03355456e−007
C2       2.25776586e−011
C3       −2.19259878e−014
C4       4.32573397e−018
C5       −7.92477159e−022
C6       7.57618874e−026
C7       −7.14962797e−030
C8       0.00000000e+000
C9       0.00000000e+000
Asphere of Lens L605
K        −1.1417
C1       1.33637337e−007
C2       1.56787758e−011
C3       −1.64362484e−014
C4       3.59793786e−018
C5       −5.11312568e−022
C6       1.70636633e−026
C7       1.82384731e−030
C8       0.00000000e+000
C9       0.00000000e+000
Asphere of Lens L607
K        0.0000
C1       1.34745120e−007
C2       −2.19807543e−011
C3       1.20275881e−015
C4       4.39597377e−020
C5       −2.37132819e−023
C6       2.87510939e−027
C7       −1.42065162e−031
C8       0.00000000e+000
C9       0.00000000e+000
Asphere of Lens L609
K        0.0000
C1       6.85760526e−009
C2       −4.84524868e−013
C3       −6.28751350e−018
C4       −3.72607209e−022
C5       3.25276841e−026
C6       −4.05509974e−033
C7       −3.98843079e−035
C8       0.00000000e+000
C9       0.00000000e+000
Asphere of Lens L613
K        0.0000
C1       2.24737416e−008
C2       −4.45043770e−013
C3       −4.10272049e−017
C4       4.31632628e−021
C5       −3.27538237e−025
C6       1.44053025e−029
C7       −2.76858490e−034
C8       0.00000000e+000
C9       0.00000000e+000
Asphere of Lens L616
K        0.0000
C1       −2.83553693e−008
C2       −1.12122261e−011
C3       −2.05192812e−016
C4       −1.55525080e−020
C5       −4.77093112e−024
C6       8.39331135e−028
C7       −8.97313681e−032

TABLE 6-continued

| | |
|---|---|
| C8 | 0.00000000e+000 |
| C9 | 0.00000000e+000 |
| Asphere of Lens L622 | |
| K | 0.0421 |
| C1 | 7.07310826e-010 |
| C2 | -2.00157185e-014 |
| C3 | -9.33825109e-020 |
| C4 | 1.27125854e-024 |
| C5 | 1.94008709e-027 |
| C6 | -6.11989858e-032 |
| C7 | 2.92367322e-036 |
| C8 | 0.00000000e+000 |
| C9 | 0.00000000e+000 |
| Asphere of Lens L624 | |
| K | 0.0000 |
| C1 | 3.02835805e-010 |
| C2 | -2.40484062e-014 |
| C3 | -3.22339189e-019 |
| C4 | 1.64516979e-022 |
| C5 | -8.51268614e-027 |
| C6 | 2.09276792e-031 |
| C7 | -4.74605669e-036 |
| C8 | 0.00000000e+000 |
| C9 | 0.00000000e+000 |
| Asphere of Lens L625 | |
| K | 0.0000 |
| C1 | -3.99248993e-010 |
| C2 | 5.79276562e-014 |
| C3 | 3.53241478e-018 |
| C4 | -4.57872308e-023 |
| C5 | -6.29695208e-027 |
| C6 | 1.57844931e-031 |
| C7 | -2.19266130e-036 |
| C8 | 0.00000000e+000 |
| C9 | 0.00000000e+000 |
| Asphere of Lens L628 | |
| K | 0.0000 |
| C1 | 4.40737732e-008 |
| C2 | 1.52385268e-012 |
| C3 | -5.44510329e-016 |
| C4 | 6.32549789e-020 |
| C5 | -4.58358203e-024 |
| C6 | 1.92230388e-028 |
| C7 | -3.11311258e-033 |
| C8 | 0.00000000e+000 |
| C9 | 0.00000000e+000 |

TABLE 7

M1630a

| LENSES | RADII | THICKNESSES | GLASSES | EFRACTIVE INDEX AT 193.304 nm | 1/2 FREE DIAMETER |
|---|---|---|---|---|---|
| 0 | infinite | 32.989007360 | L710 | 0.99998200 | 56.080 |
| | infinite | 2.050119724 | L710 | 0.99998200 | 63.700 |
| L701 | 1292.577885893AS | 17.083079028 | SIO2 | 1.56028895 | 64.846 |
| | -320.912994055 | 6.356545111 | HE | 0.99971200 | 65.549 |
| L702 | -222.076099367 | 9.996105426 | SIO2 | 1.56028895 | 65.651 |
| | -173.186007383 | 14.918724377 | HE | 0.99971200 | 66.515 |
| L703 | -465.289541055 | 12.849128877 | SIO2 | 1.56028895 | 65.892 |
| | -190.575077708 | 24.825544140 | HE | 0.99971200 | 66.089 |
| L704 | -88.003869940 | 9.278158320 | SIO2 | 1.56028895 | 64.773 |
| | -80.342454766AS | 3.110021891 | HE | 0.99971200 | 66.529 |
| L705 | -104.692897461AS | 6.185438880 | SIO2 | 1.56028895 | 63.593 |
| | 687.929853355 | 8.052826671 | HE | 0.99971200 | 65.986 |
| L706 | -4211.039282601 | 6.185438880 | SIO2 | 1.56028895 | 66.833 |
| | 191.063416206 | 42.178241931 | HE | 0.99971200 | 69.389 |
| L707 | -115.620656932 | 6.185438880 | SIO2 | 1.56028895 | 71.596 |
| | 10919.608812170AS | 23.544585745 | HE | 0.99971200 | 91.649 |
| L708 | -462.245785462 | 36.857934334 | SIO2 | 1.56028895 | 105.419 |
| | -166.710127403 | 0.922637637 | HE | 0.99971200 | 110.921 |
| L709 | -2362.175430424AS | 61.803635845 | SIO2 | 1.56028895 | 140.744 |
| | -209.701792909 | 1.020714627 | HE | 0.99971200 | 144.651 |
| L710 | -389.602200799 | 25.772662000 | SIO2 | 1.56028895 | 151.693 |
| | -307.008965979 | 0.721634536 | HE | 0.99971200 | 156.014 |

TABLE 7-continued

| | | | | | |
|---|---|---|---|---|---|
| L711 | 629.229001456 | 46.511934207 | SIO2 | 1.56028895 | 167.044 |
| | -859.369679090 | 24.151857437 | HE | 0.99971200 | 167.077 |
| L712 | -877.205712077 | 30.754166393 | SIO2 | 1.56028895 | 164.429 |
| | -357.572652646 | 4.953800031 | HE | 0.99971200 | 164.440 |
| L713 | 168.111512940 | 68.382989629 | SIO2 | 1.56028895 | 129.450 |
| | infinite | 0.000000000 | HE | 0.99971200 | 125.021 |
| L714 | infinite | 8.247251840 | SIO2 | 1.56028895 | 125.021 |
| | 149.672876100AS | 23.428435757 | HE | 0.99971200 | 98.364 |
| L715 | 167.316121704 | 0.000000000 | SIO2 | 1.56028895 | 92.117 |
| | 167.316121704 | 46.368104843 | HE | 0.99971200 | 92.117 |
| L716 | -276.014955570 | 6.185438880 | SIO2 | 1.56028895 | 90.583 |
| | 122.032488640AS | 68.057116286 | HE | 0.99971200 | 84.260 |
| L717 | -131.026926440 | 6.185438880 | SIO2 | 1.56028895 | 85.665 |
| | 1443.442379280 | 24.936997937 | HE | 0.99971200 | 105.177 |
| L718 | -570.720178737 | 31.985422479 | SIO2 | 1.56028895 | 114.725 |
| | -251.966065824 | 0.742435413 | HE | 0.99971200 | 122.318 |
| L719 | -792.022948046 | 31.395737994 | SIO2 | 1.56028895 | 136.726 |
| | -284.699402375 | 0.732480789 | HE | 0.99971200 | 139.887 |
| L720 | -1399.942577177 | 28.528105133 | SIO2 | 1.56028895 | 152.678 |
| | -405.074653331 | 0.721634536 | HE | 0.99971200 | 154.617 |
| L721 | 969.181518515 | 52.876050649 | SIO2 | 1.56028895 | 166.429 |
| | -498.113891823 | 15.463597200 | HE | 0.99971200 | 167.335 |
| | infinite | -10.309064800 | HE | 0.99971200 | 163.661 |
| L722 | 369.912797108AS | 22.457291722 | SIO2 | 1.56028895 | 164.702 |
| | 546.240476474 | 0.759815621 | HE | 0.99971200 | 163.421 |
| L723 | 435.783427872 | 59.712335014 | SIO2 | 1.56028895 | 163.043 |
| | -757.138748183 | 38.604277894 | HE | 0.99971200 | 161.173 |
| L724 | -268.662949002 | 15.463597200 | SIO2 | 1.56028895 | 159.696 |
| | -299.983850179AS | 20.130367113 | HE | 0.99971200 | 160.684 |
| L725 | -232.880394011AS | 19.892839003 | SIO2 | 1.56028895 | 159.263 |
| | -238.077482924 | 0.721634536 | HE | 0.99971200 | 162.099 |
| L726 | 238.488298578 | 23.631362631 | SIO2 | 1.56028895 | 127.621 |
| | 378.766536032 | 0.721634536 | HE | 0.99971200 | 124.291 |
| L727 | 136.105324171 | 29.608483074 | SIO2 | 1.56028895 | 108.001 |
| | 205.107042559 | 0.785819222 | HE | 0.99971200 | 104.429 |
| L728 | 143.303538802 | 37.757018324 | SIO2 | 1.56028895 | 96.584 |
| | 1247.979376087AS | 8.449273703 | HE | 0.99971200 | 91.946 |
| L729 | infinite | 26.717587971 | CaF2 | 1.50143563 | 85.145 |
| | infinite | 5.154532400 | L710 | 0.99998200 | 65.152 |
| L730 | infinite | 25.772662000 | CaF2 | 1.50143563 | 54.537 |
| | infinite | 10.309064800 | L710 | 0.99998200 | 35.251 |
| L731 | infinite | 0.000000000 | | | 14.020 |

L710 = Air at 710 Torr
ASPHERIC CONSTANTS
Asphere of Lens L701
K        0.0000
C1       6.70377274e-008
C2       6.84099199e-013
C3       1.05733405e-016
C4       3.37349453e-020
C5      -7.15705547e-024
C6       5.09786203e-028
C7      -6.46970874e-033
C8       0.00000000e+000
C9       0.00000000e+000
Asphere of Lens L704
K       -1.3610
C1      -2.19369509e-007
C2       7.67800088e-012
C3      -6.07796875e-015
C4       7.90645856e-019
C5      -9.11112500e-023
C6       5.68885354e-027
C7      -4.26463481e-031
C8       0.00000000e+000
C9       0.00000000e+000
Asphere of Lens L705
K       -1.2060
C1       8.09444891e-008
C2       4.80824558e-012
C3      -4.20373603e-015
C4       5.60648644e-019
C5      -4.51520330e-023
C6       1.54505188e-027
C7       5.00741161e-032
C8       0.00000000e+000
C9       0.00000000e+000

TABLE 7-continued

| | |
|---|---|
| Asphere of Lens L707 | |
| K | 0.0000 |
| C1 | 7.63455153e−008 |
| C2 | −8.56292259e−012 |
| C3 | 3.01669569e−016 |
| C4 | 9.61573017e−021 |
| C5 | −2.67588216e−024 |
| C6 | 2.05728418e−028 |
| C7 | −6.45595651e−033 |
| C8 | 0.00000000e+000 |
| C9 | 0.00000000e+000 |
| Asphere of Lens L709 | |
| K | 0.0000 |
| C1 | 3.23214391e−009 |
| C2 | −1.67326019e−013 |
| C3 | −4.26702152e−019 |
| C4 | −5.66712884e−023 |
| C5 | −1.24256704e−028 |
| C6 | 1.64124726e−031 |
| C7 | −4.41379927e−036 |
| C8 | 0.00000000e+000 |
| C9 | 0.00000000e+000 |
| Asphere of Lens L714 | |
| K | 0.0000 |
| C1 | −1.63753926e−009 |
| C2 | 2.54837542e−013 |
| C3 | 8.79430055e−018 |
| C4 | 9.19127213e−022 |
| C5 | −7.01950932e−026 |
| C6 | 1.17918461e−029 |
| C7 | −8.74308763e−034 |
| C8 | 0.00000000e+000 |
| C9 | 0.00000000e+000 |
| Asphere of Lens L716 | |
| K | 0.0000 |
| C1 | −1.54725313e−008 |
| C2 | −4.26275476e−012 |
| C3 | −1.01484275e−016 |
| C4 | 8.37843426e−022 |
| C5 | −1.29202167e−024 |
| C6 | 1.71820044e−028 |
| C7 | −1.05335330e−032 |
| C8 | 0.00000000e+000 |
| C9 | 0.00000000e+000 |
| Asphere of Lens L722 | |
| K | −0.0331 |
| C1 | 2.56540619e−011 |
| C2 | −6.98183157e−015 |
| C3 | 7.92101859e−021 |
| C4 | −5.85807569e−025 |
| C5 | 2.42288782e−028 |
| C6 | −5.79467899e−033 |
| C7 | 1.63689132e−037 |
| C8 | 0.00000000e+000 |
| C9 | 0.00000000e+000 |
| Asphere of Lens L724 | |
| K | 0.0000 |
| C1 | 8.90820785e−011 |
| C2 | −1.06772804e−014 |
| C3 | −1.68281363e−019 |
| C4 | 3.04828021e−023 |
| C5 | −1.01185483e−027 |
| C6 | 1.61617917e−032 |
| C7 | −2.40582729e−037 |
| C8 | 0.00000000e+000 |
| C9 | 0.00000000e+000 |
| Asphere of Lens L725 | |
| K | 0.0000 |
| C1 | −1.97757640e−010 |
| C2 | 2.05110497e−014 |
| C3 | 8.96864099e−019 |
| C4 | −9.85543257e−024 |
| C5 | −7.12993590e−028 |
| C6 | 1.30146671e−032 |
| C7 | −1.36102788e−037 |
| C8 | 0.00000000e+000 |
| C9 | 0.00000000e+000 |
| Asphere of Lens L728 | |
| K | 0.0000 |

TABLE 7-continued

| | |
|---|---|
| C1 | 2.55097376e-008 |
| C2 | 5.47467657e-013 |
| C3 | -1.43568713e-016 |
| C4 | 1.17677649e-020 |
| C5 | -5.95320448e-025 |
| C6 | 1.71763367e-029 |
| C7 | -1.94556007e-034 |
| C8 | 0.00000000e+000 |
| C9 | 0.00000000e+000 |

TABLE 8

L61

| LENSES | RADII | THICKNESSES | GLASSES | EFRACTIVE INDEX AT 157.13 nm | 1/2 FREE DIAMETER |
|---|---|---|---|---|---|
| 0 | infinite | 34.000000000 | | 1.00000000 | 82.150 |
| | infinite | 0.100000000 | | 1.00000000 | 87.654 |
| L801 | 276.724757380 | 40.000000000 | CaF2 | 1.55970990 | 90.112 |
| | 1413.944109416AS | 95.000000000 | | 1.00000000 | 89.442 |
| SP1 | infinite | 11.000000000 | | 1.00000000 | 90.034 |
| | infinite | 433.237005445 | | 1.00000000 | 90.104 |
| L802 | -195.924336384 | 17.295305525 | CaF2 | 1.55970990 | 92.746 |
| | -467.658808527 | 40.841112468 | | 1.00000000 | 98.732 |
| L803 | -241.385736441 | 15.977235467 | CaF2 | 1.55970990 | 105.512 |
| | -857.211727400AS | 21.649331094 | | 1.00000000 | 118.786 |
| SP2 | infinite | 0.000010000 | | 1.00000000 | 139.325 |
| | 253.074839896 | 21.649331094 | | 1.00000000 | 119.350 |
| L803' | 857.211727400AS | 15.977235467 | CaF2 | 1.55970990 | 118.986 |
| | 241.385736441 | 40.841112468 | | 1.00000000 | 108.546 |
| L802' | 467.658808527 | 17.295305525 | CaF2 | 1.55970990 | 102.615 |
| | 195.924336384 | 419.981357165 | | 1.00000000 | 95.689 |
| SP3 | infinite | 6.255658280 | | 1.00000000 | 76.370 |
| | infinite | 42.609155219 | | 1.00000000 | 76.064 |
| Z1 | infinite | 67.449547115 | | 1.00000000 | 73.981 |
| L804 | 432.544479547 | 37.784311058 | CaF2 | 1.55970990 | 90.274 |
| | -522.188532471 | 113.756133662 | | 1.00000000 | 92.507 |
| L805 | -263.167605725 | 33.768525968 | CaF2 | 1.55970990 | 100.053 |
| | -291.940616829AS | 14.536591424 | | 1.00000000 | 106.516 |
| L806 | 589.642961222AS | 20.449887046 | CaF2 | 1.55970990 | 110.482 |
| | -5539.698828792 | 443.944079795 | | 1.00000000 | 110.523 |
| L807 | 221.780582003 | 9.000000000 | CaF2 | 1.55970990 | 108.311 |
| | 153.071443064 | 22.790060084 | | 1.00000000 | 104.062 |
| L808 | 309.446967518 | 38.542735318 | CaF2 | 1.55970990 | 104.062 |
| | -2660.227900099 | 0.100022286 | | 1.00000000 | 104.098 |
| L809 | 23655.354584194 | 12.899131182 | CaF2 | 1.55970990 | 104.054 |
| | -1473.189213176 | 9.318886362 | | 1.00000000 | 103.931 |
| L810 | -652.136459374 | 16.359499814 | CaF2 | 1.55970990 | 103.644 |
| | -446.489459129 | 0.100000000 | | 1.00000000 | 103.877 |
| L811 | 174.593507050 | 25.900313780 | CaF2 | 1.55970990 | 99.267 |
| | 392.239615259AS | 14.064505431 | | 1.00000000 | 96.610 |
| | infinite | 2.045119392 | | 1.00000000 | 96.552 |
| L812 | 7497.306838492 | 16.759051656 | CaF2 | 1.55970990 | 96.383 |
| | 318.210831711 | 8.891640764 | | 1.00000000 | 94.998 |
| L813 | 428.724465129 | 41.295806263 | CaF2 | 1.55970990 | 95.548 |
| | 3290.097860119AS | 7.377912006 | | 1.00000000 | 95.040 |
| L814 | 721.012739719 | 33.927118706 | CaF2 | 1.55970990 | 95.443 |
| | -272.650872353 | 6.871397517 | | 1.00000000 | 95.207 |
| L815 | 131.257556743 | 38.826450065 | CaF2 | 1.55970990 | 81.345 |
| | 632.112566477AS | 4.409527396 | | 1.00000000 | 74.847 |
| L816 | 342.127616157AS | 37.346293509 | CaF2 | 1.55970990 | 70.394 |
| | 449.261078744 | 4.859754445 | | 1.00000000 | 54.895 |
| L817 | 144.034814702 | 34.792179308 | CaF2 | 1.55970990 | 48.040 |
| | -751.263321098AS | 11.999872684 | | 1.00000000 | 33.475 |
| 0' | infinite | 0.000127776 | | 1.00000000 | 16.430 |

ASPHERIC CONSTANTS
Asphere of Lens L801

| | |
|---|---|
| K | 0.0000 |
| C1 | 4.90231706e-009 |
| C2 | 3.08634889e-014 |
| C3 | -9.53005325e-019 |
| C4 | -6.06316417e-024 |
| C5 | 6.11462814e-028 |
| C6 | -8.64346302e-032 |
| C7 | 0.00000000e+000 |

TABLE 8-continued

```
C8           0.00000000e+000
C9           0.00000000e+000
Asphere of Lens L803
K            0.0000
C1          -5.33460884e-009
C2           9.73867225e-014
C3          -3.28422058e-018
C4           1.50550421e-022
C5           0.00000000e+000
C6           0.00000000e+000
C7           0.00000000e+000
C8           0.00000000e+000
C9           0.00000000e+000
Asphere of Lens L803'
K            0.0000
C1           5.33460884e-009
C2          -9.73867225e-014
C3           3.28422058e-018
C4          -1.50550421e-022
C5           0.00000000e+000
C6           0.00000000e+000
C7           0.00000000e+000
C8           0.00000000e+000
C9           0.00000000e+000
Asphere of Lens L805
K            0.0000
C1           2.42569449e-009
C2           3.96137865e-014
C3          -2.47855149e-018
C4           7.95092779e-023
C5           0.00000000e+000
C6           0.00000000e+000
C7           0.00000000e+000
C8           0.00000000e+000
C9           0.00000000e+000
Asphere of Lens L806
K            0.0000
C1          -6.74111232e-009
C2          -2.57289693e-014
C3          -2.81309020e-018
C4           6.70057831e-023
C5           5.06272344e-028
C6          -4.81282974e-032
C7           0.00000000e+000
C8           0.00000000e+000
C9           0.00000000e+000
Asphere of Lens L811
K            0.0000
C1           2.28889624e-008
C2          -1.88390559e-014
C3           2.86010656e-017
C4          -3.18575336e-021
C5           1.45886017e-025
C6          -1.08492931e-029
C7           0.00000000e+000
C8           0.00000000e+000
C9           0.00000000e+000
Asphere of Lens L813
K            0.0000
C1           3.40212872e-008
C2          -1.08008877e-012
C3           4.33814531e-017
C4          -7.40125614e-021
C5           5.66856812e-025
C6           0.00000000e+000
C7           0.00000000e+000
C8           0.00000000e+000
C9           0.00000000e+000
Asphere of Lens L815
K            0.0000
C1          -3.15395039e-008
C2           4.30010133e-012
C3           3.11663337e-016
C4          -3.64089769e-020
C5           1.06073268e-024
C6           0.00000000e+000
C7           0.00000000e+000
C8           0.00000000e+000
C9           0.00000000e+000
```

TABLE 8-continued

```
Asphere of Lens L816
K            0.0000
C1          -2.16574623e-008
C2          -6.67182801e-013
C3           4.46519932e-016
C4          -3.71571535e-020
C5           0.00000000e+000
C6           0.00000000e+000
C7           0.00000000e+000
C8           0.00000000e+000
C9           0.00000000e+000
Asphere of Lens L817
K            0.0000
C1           2.15121397e-008
C2          -1.65301726e-011
C3          -5.03883747e-015
C4           1.03441815e-017
C5          -6.29122773e-021
C6           1.44097714e-024
C7           0.00000000e+000
C8           0.00000000e+000
C9           0.00000000e+000
```

What is claimed is:

1. A projection objective defining a maximum lens diameter (D2) and comprising:

a plurality of lenses defining an object plane (O) and an image plane (O');

at least two of said lenses having respective mutually adjacent lens surfaces which are aspheric to define a double asphere;

said double asphere being mounted at a distance from said image plane (O') corresponding at least to said maximum lens diameter (D2);

the lenses of said double asphere defining a mean lens diameter; and, said mutually adjacent lens surfaces being mounted at a spacing from each other which is less than half of said mean lens diameter.

2. The projection objective of claim 1, wherein said plurality of lenses defines at least two constrictions.

3. The projection objective of claim 1, comprising at least two of said double aspheres and said spacings thereof are equidistant.

4. The projection objective of claim 3, wherein the radii of the best-fitting spherical lens surfaces of one of said double aspheres differ from one another by less than 30%.

5. The projection objective of claim 1, wherein the apex radii of the best-fitting spherical lens surfaces of a double asphere, which are assigned to the respective aspheric lens surfaces (AS1 to AS4), differ from one another by less than 30%.

6. The projection objective of claim 1, wherein the diameters of the first thirteen lens surfaces hardly differ from each other, preferably by less than 10%.

7. The projection objective of claim 1, wherein a numerical aperture of at least 0.8 is made available by the double asphere.

8. The projection objective of claim 1, wherein a numerical aperture of at least 0.9 is made available by the double asphere.

9. The projection objective of claim 1, wherein two mutually adjacent lens surfaces define an intermediate space chargeable with a fluid.

10. The projection objective of claim 1, wherein at least 40% of the lenses are spherical.

11. The projection objective of claim 1, wherein at least 60% of the lenses are spherical.

* * * * *

UNITED STATES PATENT AND TRADEMARK OFFICE
CERTIFICATE OF CORRECTION

PATENT NO. : 6,646,718 B2
DATED : November 11, 2003
INVENTOR(S) : Karl-Heinz Schuster et al.

It is certified that error appears in the above-identified patent and that said Letters Patent is hereby corrected as shown below:

Column 1,
Line 10, delete "100 21 735.7" and substitute -- 100 21 739.7 -- therefor.

Column 2,
Line 65, delete "radius" and substitute -- radii -- therefor.

Column 6,
Line 35, delete "L21." and substitute -- L212. -- therefor.

Columns 19 and 20,
Table 5, heading, delete "EFRACTIVE" and substitute -- REFRACTIVE -- therefor.
Table 6, heading, delete "EFRACTIVE" and substitute -- REFRACTIVE -- therefor.
Table 7, heading, delete "EFRACTIVE" and substitute -- REFRACTIVE -- therefor.
Table 8, heading, delete "EFRACTIVE" and substitute -- REFRACTIVE -- therefor.

Signed and Sealed this

Thirteenth Day of April, 2004

JON W. DUDAS
*Acting Director of the United States Patent and Trademark Office*